US012295234B2

(12) United States Patent
Xu et al.

(10) Patent No.: US 12,295,234 B2
(45) Date of Patent: May 6, 2025

(54) DISPLAY SUBSTRATE AND MANUFACTURING METHOD THEREFOR, AND DISPLAY PANEL AND DISPLAY DEVICE

(71) Applicants: Beijing BOE Display Technology Co., Ltd., Beijing (CN); BOE Technology Group Co., Ltd., Beijing (CN)

(72) Inventors: Chuanxiang Xu, Beijing (CN); Shi Shu, Beijing (CN); Qi Yao, Beijing (CN); Guangcai Yuan, Beijing (CN); Haitao Huang, Beijing (CN); Yong Yu, Beijing (CN); Yang Yue, Beijing (CN); Zhongyuan Sun, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 411 days.

(21) Appl. No.: 17/776,817

(22) PCT Filed: Jan. 5, 2021

(86) PCT No.: PCT/CN2021/070370
§ 371 (c)(1),
(2) Date: May 13, 2022

(87) PCT Pub. No.: WO2021/139660
PCT Pub. Date: Jul. 15, 2021

(65) Prior Publication Data
US 2022/0384531 A1 Dec. 1, 2022

(30) Foreign Application Priority Data
Jan. 6, 2020 (CN) .......................... 202010010732.4

(51) Int. Cl.
*H10K 59/40* (2023.01)
*G06F 3/041* (2006.01)
(Continued)

(52) U.S. Cl.
CPC ........... *H10K 59/40* (2023.02); *G06F 3/0412* (2013.01); *G06F 3/044* (2013.01); *H10K 59/122* (2023.02); *H10K 71/00* (2023.02); *H10K 59/1201* (2023.02)

(58) Field of Classification Search
CPC ...... H10K 59/40; H10K 59/122; H10K 71/00; H10K 59/1201; H10K 59/8731; G06F 3/0412; G06F 3/044
See application file for complete search history.

(56) References Cited

U.S. PATENT DOCUMENTS

2012/0235558 A1 9/2012 Matsuda et al.
2016/0349899 A1 12/2016 Hwang et al.
(Continued)

FOREIGN PATENT DOCUMENTS

CN 1852625 A 10/2006
CN 106158917 A 11/2016
(Continued)

OTHER PUBLICATIONS

CN202010010732.4 first office action.
(Continued)

*Primary Examiner* — Douglas W Owens
(74) *Attorney, Agent, or Firm* — IPro, PLLC

(57) ABSTRACT

A display substrate includes a base substrate, a pixel definition layer, an isolation layer, and an isolated layer. The pixel definition layer includes pixel openings penetrating through the pixel definition layer. The isolation layer is not overlapping with the pixel openings. The isolation layer includes a first isolation portion and a second isolation
(Continued)

portion. A slope angle formed by at least one side edge and a bottom edge in a cross section of the second isolation portion is an obtuse angle. There is a gap between the first isolation portion and the second isolation portion at the obtuse angle. The isolated layer includes a first isolated portion covering the isolation layer, and a second isolated portion and a third isolated portion on both sides of the first isolation portion respectively. The thickness of the first isolation portion is larger than the thickness of the isolated layer.

19 Claims, 19 Drawing Sheets

(51) Int. Cl.
*G06F 3/044* (2006.01)
*H10K 59/12* (2023.01)
*H10K 59/122* (2023.01)
*H10K 71/00* (2023.01)

(56) References Cited

U.S. PATENT DOCUMENTS

| | | |
|---|---|---|
| 2018/0190731 A1 | 7/2018 | Park et al. |
| 2023/0363209 A1* | 11/2023 | Han .................. H10K 59/1201 |
| 2024/0032320 A1* | 1/2024 | Asaoka ................ H10K 71/60 |

FOREIGN PATENT DOCUMENTS

| | | | |
|---|---|---|---|
| CN | 106206649 A | 12/2016 | |
| CN | 108281462 A | 7/2018 | |
| CN | 111180497 A | 5/2020 | |
| KR | 2007099841 A | * 10/2007 | ............... H01J 1/30 |

OTHER PUBLICATIONS

CN202010010732.4 second office action.
CN202010010732.4 Decision of Rejection.
PCT/CN2021/070370 international search report and written opinion.

* cited by examiner

DISPLAY SUBSTRATE AND MANUFACTURING METHOD THEREFOR, AND DISPLAY PANEL AND DISPLAY DEVICE

CROSS-REFERENCE OF RELATED APPLICATIONS

The disclosure is a National Stage of International Application No. PCT/CN2021/070370, filed on Jan. 5, 2021, which claims priority to Chinese Patent Application No. 202010010732.4, filed with the China National Intellectual Property Administration on Jan. 6, 2020 and entitled "Display Substrate and Manufacturing Method therefor, and Display Panel and Display Device", both of which are hereby incorporated by reference in their entireties.

FIELD

The disclosure relates to the field of display technology, and particularly to a display substrate and a manufacturing method therefor, and a display panel and a display device.

BACKGROUND

Organic Electro Luminescence Display (OLED) products have advantages of fast response speed, thin thickness and high contrast ratio, and have gradually begun to erode the market of Liquid Crystal Display (LCD) products. Especially bendable and flexible characteristics of the OLED products make the OLED products become preferred technology for flexible display devices. However, in general OLED products with touch function, it is necessary to isolate cathodes of different pixels or different regions to reuse the cathodes as self-capacitance electrodes.

As shown in FIG. 1, it is a schematic diagram of a cathode isolation scheme in the related art. A base substrate 101, a pixel definition layer 102, an isolation layer 103, a cathode 104, an anode 105 and a transistor layer 106 are included, and a cross section of the isolation layer 103 is an inverted trapezoid structure in a direction perpendicular to the base substrate. This cathode isolation scheme generally cannot isolate the cathode effectively. As shown in the elliptical area in FIG. 2, a side surface of the isolation layer 103 is covered with the cathode 104, which may cause abnormal display or touch failure. Especially when the cathode is fabricated by the sputter film plating process, the diffusion effect of the sputter film plating process is better, resulting in the worse isolation effect of the cathode. Furthermore, cracks are easily generated in the process of cutting the motherboard to form a plurality of display substrates. Once the cracks caused by cutting or other reasons spread to the display region, display and touch performance of the product may be affected.

SUMMARY

In view of this, embodiments of the disclosure provide a display substrate and a manufacturing method therefor, and a display panel and a display device, to improve the display quality and the touch effect.

Therefore, a display substrate provided by an embodiment of the disclosure includes: a base substrate; a pixel definition layer, the pixel definition layer being located on a side of the base substrate and including: a plurality of pixel openings; an isolation layer, the isolation layer being located on a side of the pixel definition layer away from the base substrate, not overlapping with each of the pixel openings, and the isolation layer including a first isolation portion and a second isolation portion located on a side of the first isolation portion away from the base substrate and covering the first isolation portion, where a slope angle formed by at least one side edge and a bottom edge in a cross section of the second isolation portion is an obtuse angle in a direction perpendicular to the base substrate, and there is a gap between the first isolation portion and the second isolation portion at the obtuse angle; an isolated layer, the isolated layer being located on a side of the isolation layer away from the pixel definition layer and the isolated layer including: a first isolated portion covering the isolation layer, and a second isolated portion and a third isolated portion on both sides of the first isolation portion respectively, where a thickness of the first isolation portion is larger than a thickness of the isolated layer.

In a possible implementation, in the above display substrate provided by an embodiment of the disclosure, the isolated layer includes: a cathode located in a display region of the base substrate and multiplexed as a self-capacitance electrode.

In a possible implementation, in the above display substrate provided by an embodiment of the disclosure, the isolated layer further includes: a white light emitting layer located between the cathode and the isolation layer.

In a possible implementation, in the above display substrate provided by an embodiment of the disclosure, the isolated layer includes: a first inorganic thin film encapsulation layer and a second inorganic thin film encapsulation layer located in a bezel region of the base substrate.

In a possible implementation, in the above display substrate provided by an embodiment of the disclosure, the display region further includes: a first inorganic thin film encapsulation layer, an organic thin film encapsulation layer and a second inorganic thin film encapsulation layer located on the cathode; the thickness of the first isolation portion is smaller than a thickness of the first inorganic thin film encapsulation layer in the direction perpendicular to the base substrate.

In a possible implementation, in the above display substrate provided by an embodiment of the disclosure, a cross section of the second isolation portion is an inverted trapezoid structure and a cross section of the first isolation portion is a normal trapezoid structure or an inverted trapezoid structure in the direction perpendicular to the base substrate.

In a possible implementation, in the above display substrate provided by an embodiment of the disclosure, the first isolation portion is a metal layer or a metal oxide layer, and the second isolation portion is a spacer layer.

In a possible implementation, in the above display substrate provided by an embodiment of the disclosure, cross sections of the first isolation portion and the second isolation portion are both parallelogram structures in the direction perpendicular to the base substrate.

In a possible implementation, in the above display substrate provided by an embodiment of the disclosure, the first isolation portion and the second isolation portion are a spacer layer with an integral structure.

Based on the same disclosure concept, an embodiment of the disclosure further provides a manufacturing method for a display substrate, including: providing a base substrate; forming a pixel definition layer including a plurality of pixel openings, an isolation layer and an isolated layer sequentially on the base substrate; where: the isolation layer does not overlap with each of the pixel openings, and the isolation layer includes a first isolation portion and a second isolation portion located on a side of the first isolation portion away from the base substrate and covering the first isolation portion; a slope angle of at least one side edge in a cross section of the second isolation portion is an obtuse angle in a direction perpendicular to the base substrate, there is a gap between the first isolation portion and the second isolation portion at the obtuse angle, and a thickness of the first isolation portion is larger than a thickness of the isolated layer; the isolated layer includes: a first isolated portion covering the isolation layer, and a second isolated portion and a third isolated portion on both sides of the first isolation portion respectively.

In a possible implementation, in the above manufacturing method provided by an embodiment of the disclosure, forming the isolation layer includes: forming a support layer on the pixel definition layer; forming the second isolation portion on the support layer, where a cross section of the second isolation portion is an inverted trapezoid structure in the direction perpendicular to the base substrate; etching the support layer by a wet etching process to form the first isolation portion covered by the second isolation portion; where a cross section of the first isolation portion is a normal trapezoid structure in the direction perpendicular to the base substrate, and there are gaps between two sides of the first isolation portion and the second isolation portion; constituting the isolation layer from the first isolation portion and the second isolation portion.

In a possible implementation, in the above manufacturing method provided by an embodiment of the disclosure, forming the isolation layer includes: forming a support portion on the pixel definition layer, where a cross section of the support portion is a normal trapezoid structure in the direction perpendicular to the base substrate; forming the second isolation portion on the support portion; where a cross section of the second isolation portion is an inverted trapezoid structure in the direction perpendicular to the base substrate, and an upper edge of the support portion is greater than or equal to a bottom edge of the second isolation portion; etching the support portion by a wet etching process to form the first isolation portion covered by the second isolation portion; where a cross section of the first isolation portion is a normal trapezoid structure in the direction perpendicular to the base substrate, and there are gaps between two sides of the first isolation portion and the second isolation portion; constituting the isolation layer from the first isolation portion and the second isolation portion.

In a possible implementation, in the above manufacturing method provided by an embodiment of the disclosure, forming the isolation layer includes: forming a pair of support portions on the pixel definition layer, where cross sections of the pair of support portions are two normal trapezoid structures with a gap in the direction perpendicular to the base substrate; forming the isolation layer on the pair of support portions, where the isolation layer includes the first isolation portion filling the gap, and the second isolation portion covering the pair of support portions and the gap; cross sections of the first isolation portion and the second isolation portion are both inverted trapezoid structures in the direction perpendicular to the base substrate, and there are gaps between two sides of the first isolation portion and the second isolation portion; etching the pair of support portions by a wet etching process to remove a pattern of the pair of support portions.

In a possible implementation, in the above manufacturing method provided by an embodiment of the disclosure, forming the isolation layer includes: forming a support portion on the pixel definition layer, where a cross section of the support portion is a normal trapezoid structure in the direction perpendicular to the base substrate; forming the isolation layer on the support portion, where the isolation layer includes the first isolation portion with a same height as the support portion, and the second isolation portion covering the support portion and the first isolation portion; cross sections of the first isolation portion and the second isolation portion are both parallelogram structures in the direction perpendicular to the base substrate, and there is a gap between a side of the first isolation portion and the second isolation portion; etching the support portion by a wet etching process to remove a pattern of the support portion.

In a possible implementation, in the above manufacturing method provided by an embodiment of the disclosure, after forming the pixel definition layer including the plurality of pixel openings and before forming the isolation layer, the method further includes: forming a plurality of anodes in the pixel openings, and annealing the anodes.

In a possible implementation, in the above manufacturing method provided by an embodiment of the disclosure, after forming a cathode, the method further includes: forming a first inorganic thin film encapsulation layer on a layer where the cathode is located by an atomic force deposition process.

Based on the same disclosure concept, an embodiment of the disclosure further provides a display panel, including: the above display substrate.

Based on the same disclosure concept, an embodiment of the disclosure further provides a display device, including: the above display panel.

DETAILED DESCRIPTION OF EMBODIMENTS

In order to make the purposes, technical solutions and advantages of the disclosure clearer, technical solutions of embodiments of the disclosure will be described clearly and completely below in combination with the accompanying drawings of embodiments of the disclosure. The thickness and shape of each film layer in the accompanying drawings do not reflect the true proportion, and are merely for purpose of schematically illustrating the content of the disclosure. Obviously the described embodiments are a part of embodiments of the disclosure but not all embodiments. Based upon embodiments of the disclosure, all of other embodiments obtained by those ordinary skilled in the art without creative work pertain to the protection scope of the disclosure.

Unless otherwise defined, technical or scientific terms used here shall have the general meaning understood by those ordinary skilled in the art to which the disclosure belongs. The "first", "second" and similar words used in the specification and claims of the disclosure do not represent any order, number or importance, and are only used to distinguish different components. The word such as "include" or "contain" or the like means that the element or object appearing before this word encompasses the elements or objects and their equivalents listed after this word, without excluding other elements or objects. The words such as "inner", "outer", "up", "down" are only used to represent the relative position relationship. When the absolute position of a described object changes, the relative position relationship may also change accordingly.

Figure 1:
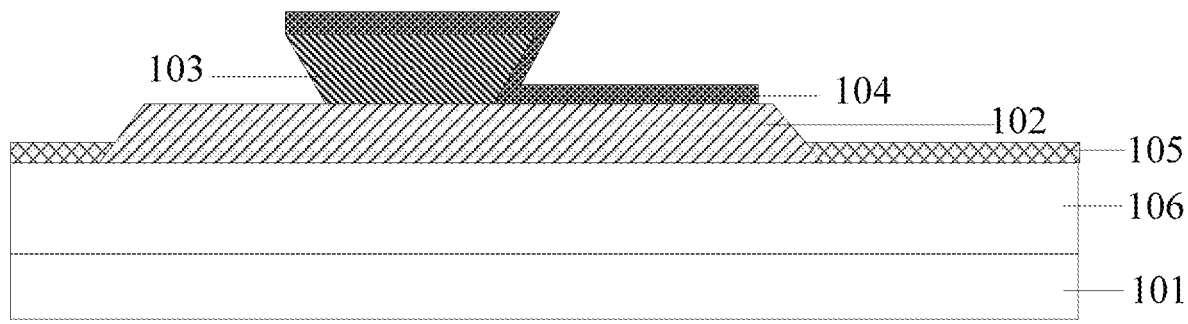
FIG. 1 is a structural schematic diagram of a display substrate in the related art.
Figure 2:
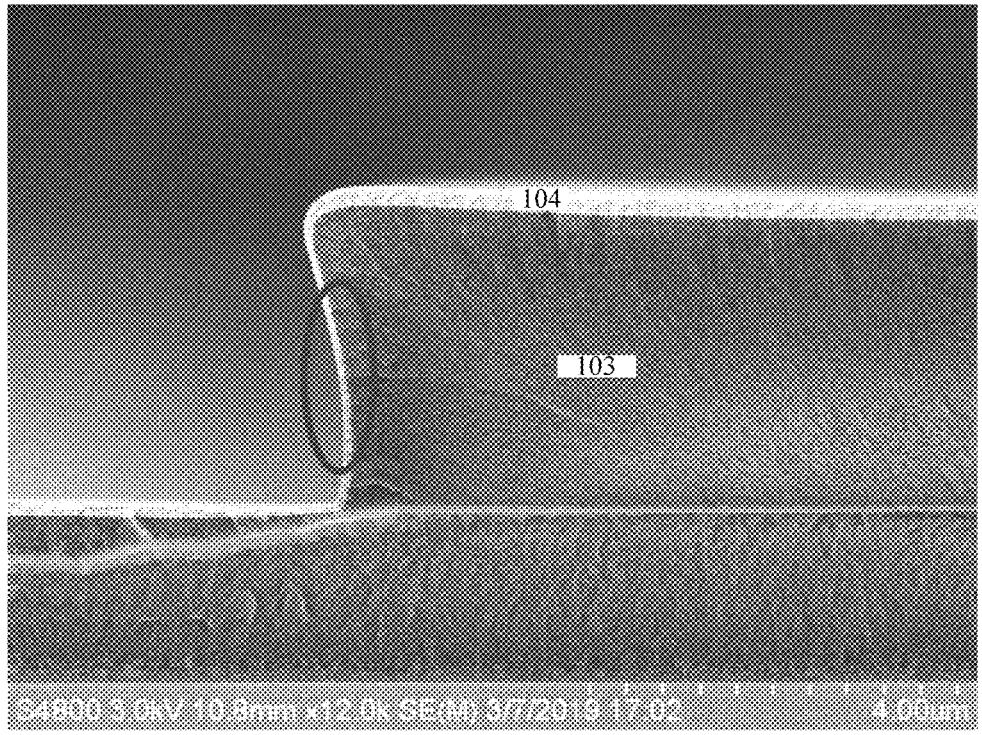
FIG. 2 is a scanning electron microscope view of the display substrate shown in FIG. 1.
Figure 3:
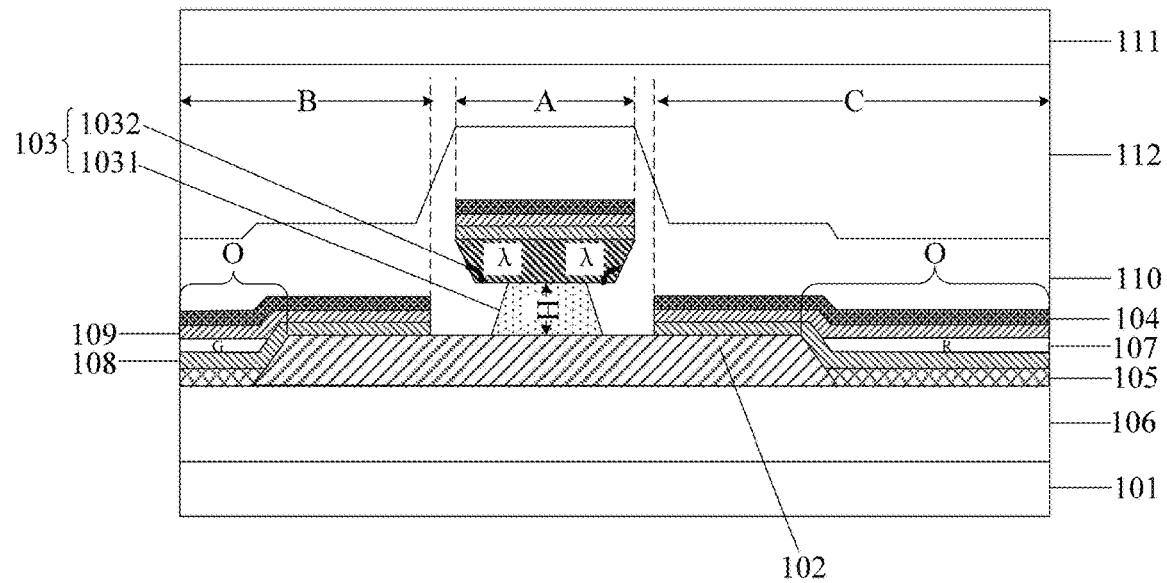
FIG. 3 is a first structural schematic diagram of a display region on a display substrate according to an embodiment of the disclosure.
Figure 4:
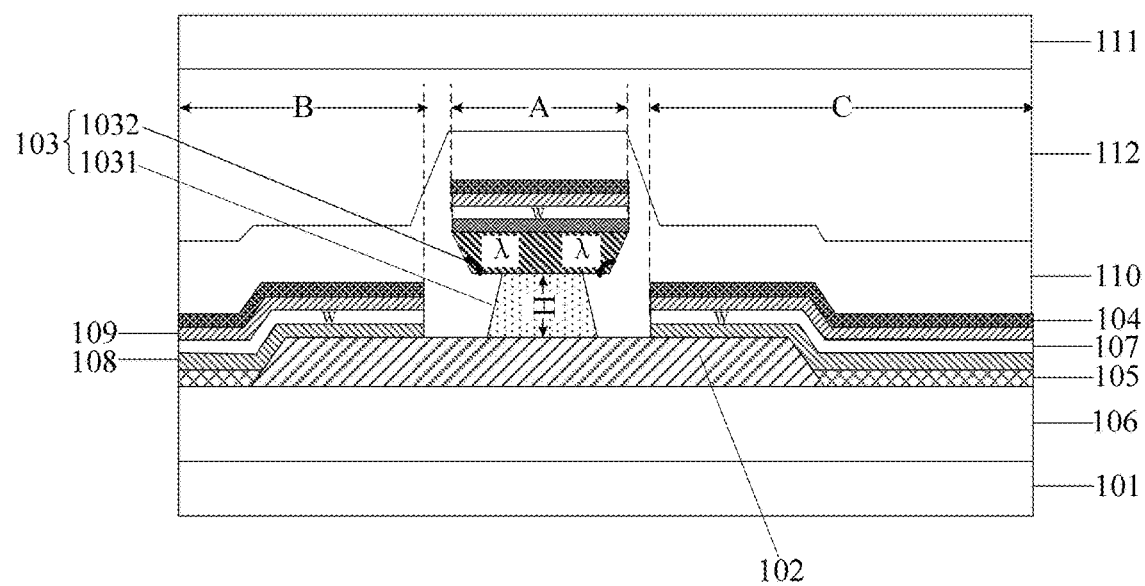
FIG. 4 is a second structural schematic diagram of a display region on a display substrate according to an embodiment of the disclosure.

A display substrate provided by an embodiment of the disclosure, as shown in FIG. 3 and FIG. 4, includes: a base substrate 101; a pixel definition layer 102, the pixel definition layer 102 is located on a side of the base substrate 101 and includes: a plurality of pixel openings O; an isolation layer 103, the isolation layer 103 is located on a side of the pixel definition layer 102 away from the base substrate 101, does not overlap with each of the pixel openings O, and the isolation layer 103 includes a first isolation portion 1031 and a second isolation portion 1032 located on a side of the first isolation portion 1031 away from the base substrate 101 and covering the first isolation portion 1031, where a slope angle formed by at least one side edge and a bottom edge in a cross section of the second isolation portion 1032 is an obtuse angle λ in a direction perpendicular to the base substrate 101, and there is a gap between the first isolation portion 1031 and the second isolation portion 1032 at the obtuse angle λ (that is, the shape of the cross section of the isolation layer 103 in the direction perpendicular to the base substrate 101 is approximately T-shaped or 'I-shaped); an isolated layer, the isolated layer is located on a side of the isolation layer 103 away from the pixel definition layer 102 and the isolated layer includes: a first isolated portion A covering the isolation layer, and a second isolated portion B and a third isolated portion C on both sides of the first isolation portion 1031 respectively, where a thickness H of the first isolation portion 1031 is larger than a thickness of the isolated layer.

Generally, the above-mentioned display substrate provided by an embodiment of the disclosure, as shown in FIG. 3 and FIG. 4, may further include: a cathode 104 located on a side of the isolation layer 103 away from the base substrate 101 and multiplexed as a self-capacitance electrode, an anode 105 disposed in each pixel opening O, a transistor layer 106 located between the base substrate 101 and the pixel definition layer 102, a light-emitting layer 107 disposed between the anode 105 and the cathode 104, a first co-evaporated layer 108 disposed between the anode 105 and the light-emitting layer 107, a second co-evaporated layer 109 disposed between the light-emitting layer 107 and the cathode 104, a first inorganic thin film encapsulation layer 110 and a second inorganic thin film encapsulation layer 111 successively disposed on a side of the cathode 104 away from the base substrate 101, and an organic thin film encapsulation layer 112 disposed between the first inorganic thin film encapsulation layer 110 and the second inorganic thin film encapsulation layer 111. In addition, generally only the first inorganic thin film encapsulation layer 110 and the second inorganic thin film encapsulation layer 111 among the above film layers are disposed in the bezel region.

Therefore, in the above-mentioned display substrate provided by an embodiment of the disclosure, the slope angle of at least one side edge in the cross section of the second isolation portion 1032 is set as an obtuse angle λ, so that the first isolated portion A is disconnected from the second isolated portion B or the third isolated portion C at least on the side edge with the obtuse angle λ; the gap is set between the first isolation portion 1031 and the second isolation portion 1032 at the obtuse angle λ (that is, the shape of the cross section of the isolation layer 103 in the direction perpendicular to the base substrate 101 is approximately T-shaped or 'I-shaped), and the thickness H of the first isolation portion 1031 is larger than the thickness of the isolated layer, so that the first isolated portion A is disconnected from the second isolated portion B or the third isolated portion C at the gap. Thus, the first isolated portion A is disconnected from at least one of the second isolated portion B and the third isolated portion C by disposing the isolation layer 103 including the first isolation portion 1031 and the second isolation portion 1032 in the disclosure.

Based on this, in the case where the isolated layer is the cathode 104 contained in the display region and multiplexed as a self-capacitance electrode, the first isolated portion A contained in the cathode 104 is disconnected from at least one of the second isolated portion B and the third isolated portion C, thereby enhancing the isolation effect of the cathode 104; in the case where the isolated layer is the first inorganic thin film encapsulation layer 110 and the second inorganic thin film encapsulation layer 111 contained in the bezel region, the thickness H of the first isolation portion 1031 contained in the isolation layer 103 is the sum of the thicknesses of the first inorganic thin film encapsulation layer 110 and the thicknesses of the second inorganic thin film encapsulation layer 111, so the first isolated portion A contained in the first inorganic thin film encapsulation layer 110 and the second inorganic thin film encapsulation layer 111 is disconnected from at least one of the second isolated portion B and the third isolated portion C, thereby effectively preventing the cracks generated in the process of cutting the motherboard to obtain a plurality of display substrates or the cracks due to other causes from extending to the display region. Therefore, the display quality and the touch effect are improved.

It is worth noting that the cathode portion multiplexed as a self-capacitance electrode generally covers a plurality of sub-pixels at the same time because the touch precision of the display product is generally less than the display precision. Based on this, the pattern of the isolation layer 103 in the disclosure is only arranged in the position where the cathode is required to be disconnected to be multiplexed as a self-capacitance electrode.

Optionally, in the above-mentioned array substrate provided by an embodiment of the disclosure, the base substrate 101 may be a flexible base substrate, for example, a plastic substrate with excellent heat resistance and durability made of polyethylene ether phthalate ester, polyethylene naphthalate, polycarbonate, polyarylate compound, polyetherimide, polyethersulfone or polyimide; or may be a rigid base substrate, for example, a glass substrate, which is not limited here.

Optionally, in the above-mentioned array substrate provided by an embodiment of the disclosure, the transistor layer 106 generally includes: a driving circuit composed of a plurality of transistors, gate lines, data lines, common voltage lines, etc., where the transistor includes a gate, an active layer, a source and a drain; the active layer includes: a channel region, and a source contact region and a drain contact region on both sides of the channel region. The transistor may be of a bottom-gate-type structure or a top-gate-type structure. Depending on the transistor type and the input signal, functions of the transistor's drain and source may be interchanged. Generally, when the transistor is a P-type transistor, the source is the input terminal of the transistor, and the drain is the output terminal of the transistor; when the transistor is an N-type transistor, the drain is the input terminal of the transistor, and the source is the output terminal of the transistor.

Furthermore, a material of the active layer may be amorphous silicon (a-Si) or metal oxide (e.g., indium gallium zinc oxide). Also, the gates, sources, drains, gate lines, data lines and common voltage lines may be made of molybdenum, aluminum, silver, copper, titanium, platinum, tungsten, tantalum, niobium, tantalum nitride, alloys and combinations thereof, or other suitable materials.

In order to simplify the manufacturing process, save the manufacturing cost and improve the production efficiency, the gate lines and the gates may be simultaneously fabricated by a single patterning process. Of course, the gate lines and the gates may also be fabricated respectively by two patterning processes, which is not limited here. The sources, drains and data lines may also be fabricated simultaneously by a single patterning process. Of course, the sources and drains and the data lines may also be fabricated respectively by two patterning processes, which is not limited here.

Optionally, in the above-mentioned display substrate provided by an embodiment of the disclosure, as shown in FIG. 3, the light-emitting layer 107 may be a three-color (red, green and blue (RGB)) light-emitting layer, that is, the light-emitting layer 107 in two adjacent pixel openings O has different luminous colors; or may be a monochromatic white-light-emitting layer. And, as shown in FIG. 4, when the light-emitting layer 107 is a white-light-emitting layer W, the thickness H of the first isolation portion 1031 is larger than the sum of the thicknesses of the white-light-emitting layer and the cathode 104 in the direction perpendicular to the base substrate 101 in order to generate cracks. Generally, when the light-emitting layer 107 is a white-light-emitting layer, the color display can also be realized by arranging a RGB color resist layer in the display substrate.

Optionally, in the above-mentioned display substrate provided by an embodiment of the disclosure, the first co-evaporated layer 108 includes but is not limited to a hole injection layer, a hole transport layer and an electron blocking layer; and the second co-evaporated layer 109 includes but is not limited to an electron injection layer, an electron transport layer and a hole blocking layer.

Optionally, in the above-mentioned display substrate provided by an embodiment of the disclosure, materials of the first inorganic thin film encapsulation layer 110 and the second inorganic thin film encapsulation layer 111 may be inorganic insulating materials such as silicon oxide, silicon nitride, silicon oxynitride, aluminum oxide, etc., which is not limited here. The material of the organic thin film encapsulation layer 112 may be organic insulating materials such as polyacrylic resin, polyepoxy acrylic resin, photosensitive polyimide resin, polyester acrylate, polyurethane acrylate resin, phenolic epoxy acrylic resin, etc., which is not limited here.

Moreover, in the above-mentioned array substrate provided by an embodiment of the disclosure, the thickness H of the first isolation portion 1031 is smaller than the thickness of the first inorganic thin film encapsulation layer 110 in the direction perpendicular to the base substrate 101 in the display region, avoiding the Thin Film Encapsulation layer (TFE) formed by the first inorganic thin film encapsulation layer 110, the organic thin film encapsulation layer 112 and the second inorganic thin film encapsulation layer 111 in the display region from breaking, and ensuring the excellent encapsulation effect.

Optionally, in the above-mentioned display substrate provided by an embodiment of the disclosure, the first isolation portion 1031 and the second isolation portion 1032 may be implemented in various manners. For example, in FIGS. 3-5 and 9-11, the cross section of the second isolation portion 1032 is an inverted trapezoid structure with a wide top and a narrow bottom (that is, the slope angles of both side edges of the cross section of the first isolation portion 1031 are both obtuse angles λ) and the cross section of the first isolation portion 1031 is a normal trapezoid structure with a narrow top and a wide bottom in the direction perpendicular to the base substrate 101, and there are gaps between the left and right sides of the second isolation portion 1032 and the first isolation portion 1031. Of course, specific implementations may also be as shown in FIGS. 6-8 and 12-15, where the cross section of the first isolation portion 1031 is a normal trapezoid structure with a narrow top and a wide bottom and the cross section of the second isolation portion 1032 is a normal trapezoid structure with a narrow top and a wide bottom in the direction perpendicular to the base substrate 101, and there are gaps between the left and right sides of the second isolation portion 1032 and the first isolation portion 1031. In this way, the cross section of the isolation layer 103 formed by the first isolation portion 1031 and the second isolation portion 1032 in the direction perpendicular to the base substrate 101 is approximately a T-shaped structure. In the above implementations, the first isolation portion 1031 may be a metal layer or a metal oxide layer, and the second isolation portion 1032 may be a spacer layer (PS), that is, the first isolation portion 1031 and the second isolation portion 1032 are two independent film layers, as shown in FIGS. 3-8; or the first isolation portion 1031 and the second isolation portion 1032 are a spacer layer (PS) with an integral structure, as shown in FIGS. 9-15.

The material of the metal layer may be, but not limited to, molybdenum, aluminum, silver, copper, titanium, platinum, tungsten, tantalum, niobium, tantalum nitride or alloys thereof. The metal oxide layer may be amorphous Indium Tin Oxide (a-ITO). Considering that the material of the anode 105 is generally a-ITO, in order to avoid damage to the anode 105 in the process of fabricating the first isolation portion 1031, the anode 105 may be annealed after the pattern of the anode 105 is completed, so that the material of the anode 105 changes from amorphous indium tin oxide to crystalline indium tin oxide.

Figure 16:
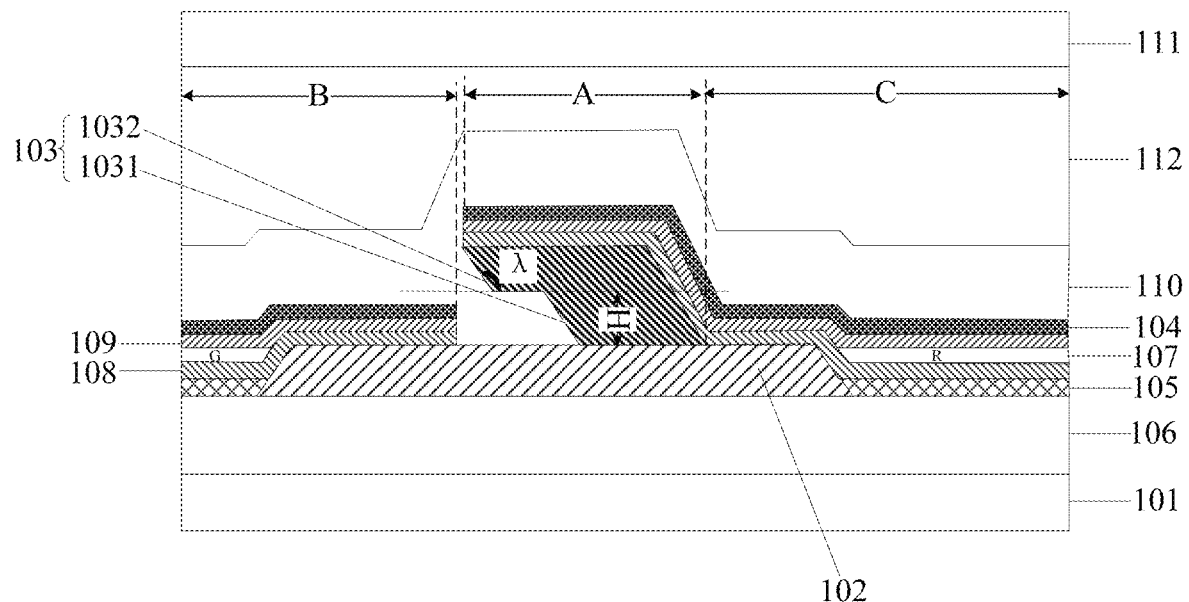
FIG. 16 is a ninth structural schematic diagram of a display region on a display substrate according to an embodiment of the disclosure.
Figure 17:
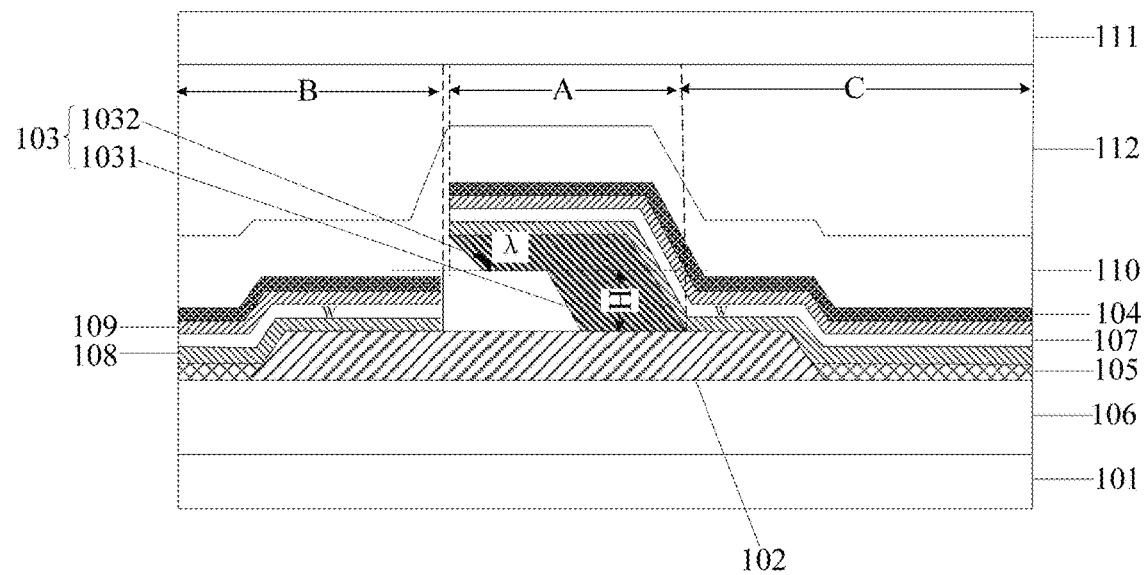
FIG. 17 is a tenth structural schematic diagram of a display region on a display substrate according to an embodiment of the disclosure.
Figure 18:
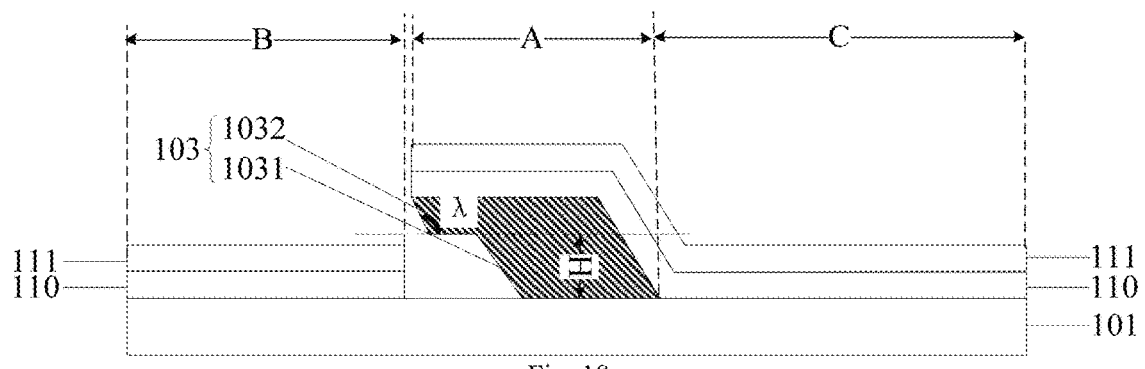
FIG. 18 is a structural schematic diagram of a bezel region on the display substrate shown in FIG. 16 or FIG. 17.
Figure 19:
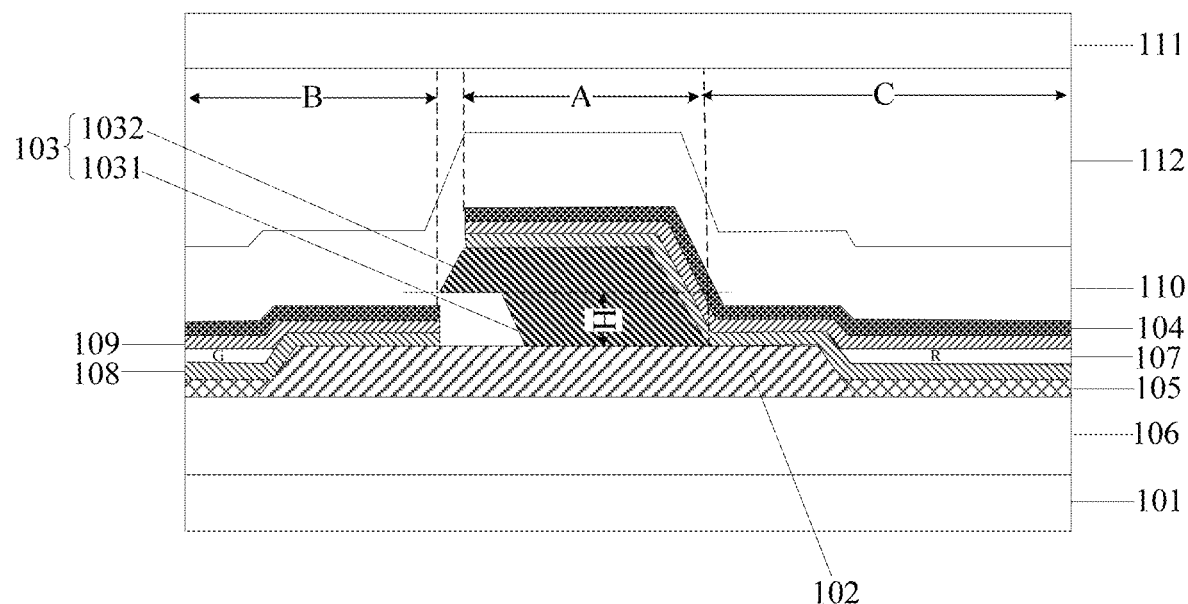
FIG. 19 is an eleventh structural schematic diagram of a display region on a display substrate according to an embodiment of the disclosure.
Figure 20:
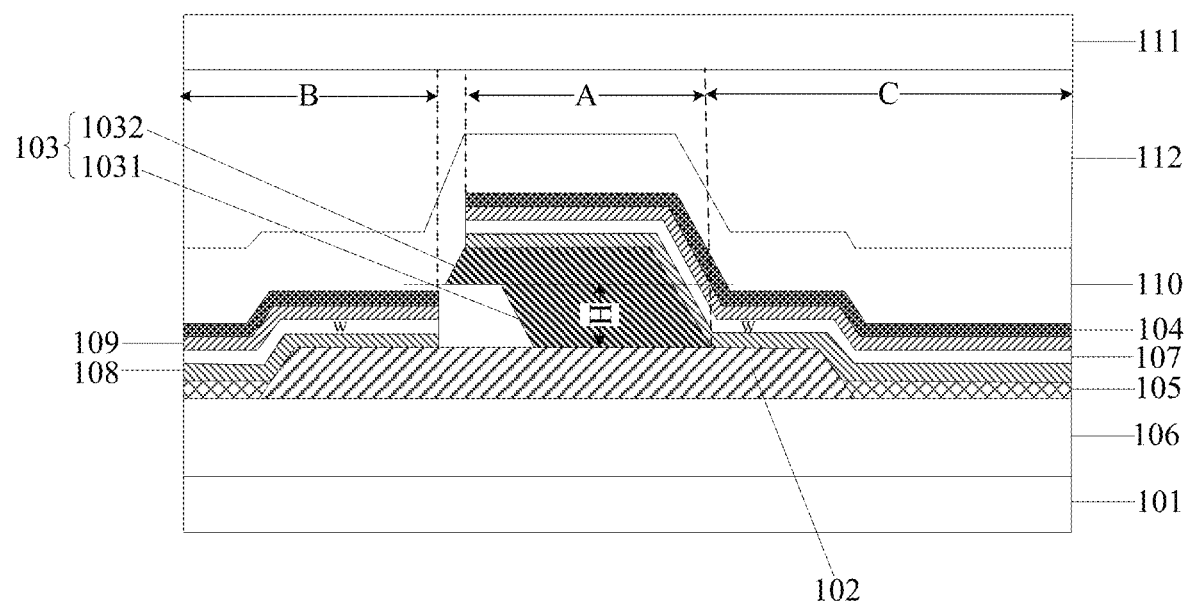
FIG. 20 is a twelfth structural schematic diagram of a display region on a display substrate according to an embodiment of the disclosure.
Figure 21:
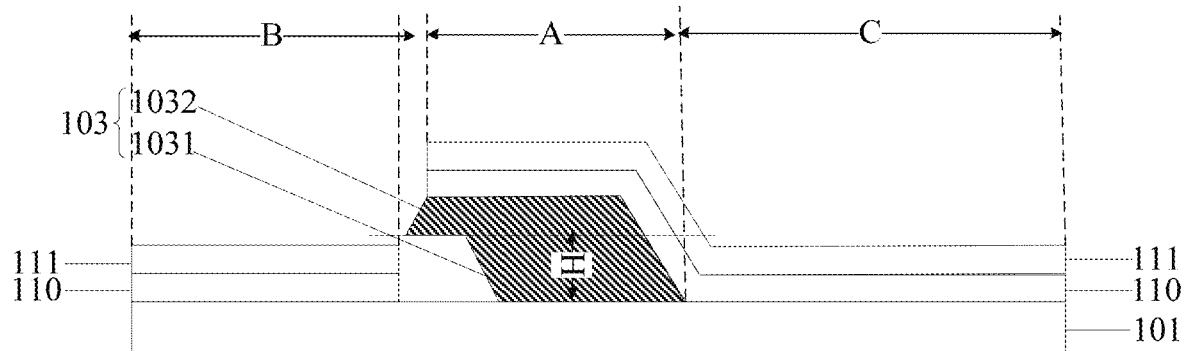
FIG. 21 is a structural schematic diagram of a bezel region on the display substrate shown in FIG. 19 or FIG. 20.

The possible implementations of the first isolation portion 1031 and the second isolation portion 1032 may also be as shown in FIGS. 16-18, where the cross sections of the first isolation portion 1031 and the second isolation portion 1032 are parallelogram structures (that is, the slope angle of one side edge of the cross section of the first isolation portion 1031 is an obtuse angle λ) in the direction perpendicular to the base substrate 101, and there is a gap between the left side of the second isolation portion 1032 and the first isolation portion 1031. Of course, specific implementations may also be as shown in FIGS. 19-21, where the cross section of the first isolation portion 1031 is a parallelogram structure and the cross section of the second isolation portion 1032 is a normal trapezoid structure with a narrow top and a wide bottom in the direction perpendicular to the base substrate 101. In this way, the cross section of the isolation layer 103 formed by the first isolation portion 1031 and the second isolation portion 1032 in the direction perpendicular to the base substrate 101 is approximately a 'T-shaped structure. In the above implementations, the first isolation portion 1031 and the second isolation portion 1032 are a spacer layer (PS) with an integral structure, as shown in FIGS. 16-21.

The above only illustrates several possible shapes of the cross sections of the first isolation portion 1031 and the second isolation portion 1032 in the direction perpendicular to the base substrate 101. In specific implementations, they may also be other shapes, such as rectangular structure, irregular trapezoid structure with curved sides, right-angled trapezoid structure, which are not limited here.

Based on the same disclosure concept, an embodiment of the disclosure provides a manufacturing method for a display substrate. Since the principle of the manufacturing method to solve the problem is the same as the principle of the above-mentioned display substrate to solve the problem, so implementations of the manufacturing method can refer to embodiments of the above-mentioned display substrate, and the repeated description thereof will be omitted. Only the differences will be introduced below.

Figure 22:
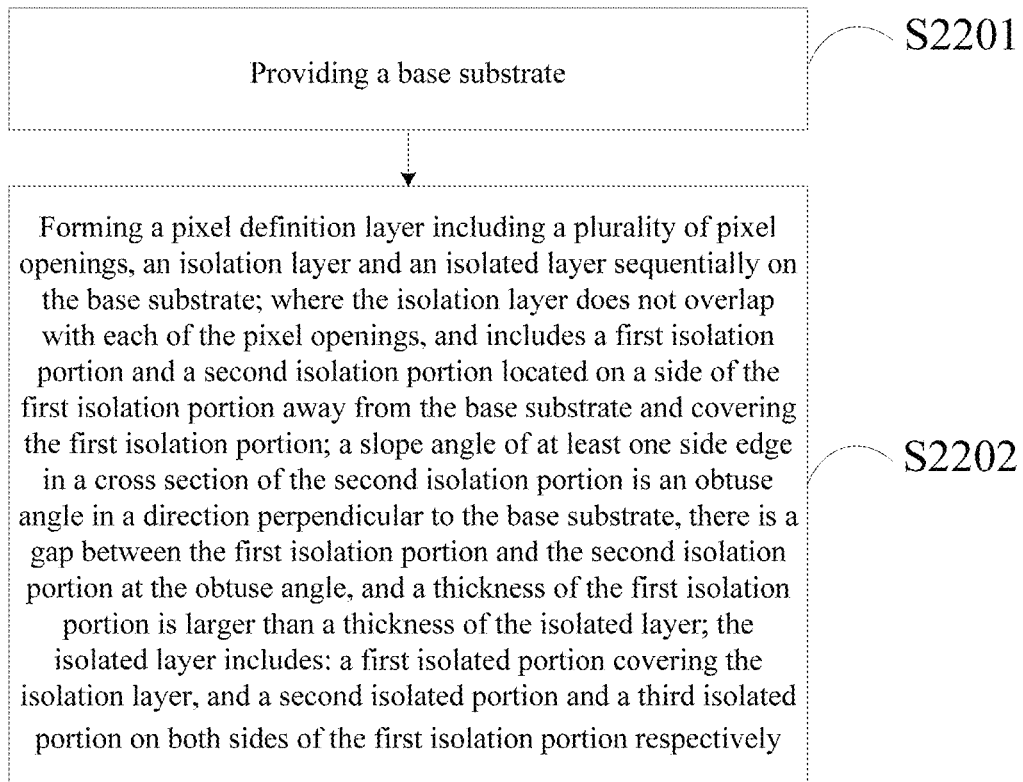
FIG. 22 is a schematic diagram of a manufacturing method for a display substrate according to an embodiment of the disclosure.

As shown in FIG. 22, a manufacturing method for a display substrate provided by an embodiment of the disclosure may include following steps.

S2201: providing a base substrate.

S2202: forming a pixel definition layer including a plurality of pixel openings, an isolation layer and an isolated layer sequentially on the base substrate.

The isolation layer does not overlap with each of the pixel openings, and the isolation layer includes a first isolation portion and a second isolation portion located on a side of the first isolation portion away from the base substrate and covering the first isolation portion.

A slope angle of at least one side edge in a cross section of the second isolation portion is an obtuse angle in a direction perpendicular to the base substrate, there is a gap between the first isolation portion and the second isolation portion at the obtuse angle, and a thickness of the first isolation portion is larger than a thickness of the isolated layer.

The isolated layer includes: a first isolated portion covering the isolation layer, and a second isolated portion and a third isolated portion on both sides of the first isolation portion respectively.

Optionally, in the above-mentioned manufacturing method provided by an embodiment of the disclosure, the isolation layer 103 may be formed by, but not limited to, four following possible implementations.

Here, the first possible implementation may include following steps: forming a support layer on the pixel definition layer; forming the second isolation portion on the support layer, where a cross section of the second isolation portion is an inverted trapezoid structure in the direction perpendicular to the base substrate; etching the support layer by a wet etching process to form the first isolation portion covered by the second isolation portion; where a cross section of the first isolation portion is a normal trapezoid structure in the direction perpendicular to the base substrate, and there are gaps between two sides of the first isolation portion and the second isolation portion; constituting the isolation layer from the first isolation portion and the second isolation portion.

The second possible implementation may include following steps: forming a support portion on the pixel definition layer, where a cross section of the support portion is a normal trapezoid structure in the direction perpendicular to the base substrate; forming the second isolation portion on the support portion; where a cross section of the second isolation portion is an inverted trapezoid structure in the direction perpendicular to the base substrate, and an upper edge of the support portion is greater than or equal to a bottom edge of the second isolation portion; etching the support portion by a wet etching process to form the first isolation portion covered by the second isolation portion; where a cross section of the first isolation portion is a normal trapezoid structure in the direction perpendicular to the base substrate, and there are gaps between two sides of the first isolation portion and the second isolation portion; constituting the isolation layer from the first isolation portion and the second isolation portion.

The third possible implementation may include following steps: forming a pair of support portions on the pixel definition layer, where cross sections of the pair of support portions are two normal trapezoid structures with a gap in the direction perpendicular to the base substrate; forming the isolation layer on the pair of support portions, where the isolation layer includes a first isolation portion filling the gap, and a second isolation portion covering the pair of support portions and the gap; cross sections of the first isolation portion and the second isolation portion are both inverted trapezoid structures in the direction perpendicular to the base substrate, and there are gaps between two sides of the first isolation portion and the second isolation portion; etching the pair of support portions by a wet etching process to remove a pattern of the pair of support portions.

The fourth possible implementation may include following steps: forming a support portion on the pixel definition layer, where a cross section of the support portion is a normal trapezoid structure in the direction perpendicular to the base substrate; forming the isolation layer on the support portion, where the isolation layer includes a first isolation portion with a same height as the support portion, and a second isolation portion covering the support portion and the first isolation portion; cross sections of the first isolation portion and the second isolation portion are both parallelogram structures in the direction perpendicular to the base substrate, and there is a gap between a side of the first isolation portion and the second isolation portion; etching the support portion by a wet etching process to remove a pattern of the support portion.

Optionally, in the above-mentioned manufacturing method provided by an embodiment of the disclosure, after the step of forming the pixel definition layer including the plurality of pixel openings is performed, and before the step of forming the isolation layer is performed, the following step may be further performed: forming a plurality of anodes in the pixel openings, and annealing the anodes.

Optionally, in the above-mentioned manufacturing method provided by an embodiment of the disclosure, after the step of forming a cathode is performed, the following step may further be performed: forming a first inorganic thin film encapsulation layer on a layer where the cathode is located by an atomic force deposition process.

In order to ensure the better encapsulation effect, there is a need for the Thin Film Encapsulation layer (TFE) in the display region where the cathode is located to not be broken due to the arrangement of the isolation layer, so the continuous first inorganic thin film encapsulation layer can be formed on the layer where the cathode is located by the atomic force deposition process with better film formation. At this time, the thickness of the first inorganic thin film encapsulation layer is independent of the thickness of the first isolation portion. In the case where the first inorganic thin film encapsulation layer is manufactured by other deposition process than the atomic force deposition, the thickness of the first inorganic thin film encapsulation layer should be larger than the thickness of the first isolation portion, to prevent the thin film encapsulation layer from breaking due to the existence of the isolation layer.

It should be noted that, in the above-mentioned manufacturing method provided by an embodiment of the disclosure, the patterning processes involved in forming various layer structures may not only include some or all of deposition, photoresist coating, masking of mask plate, exposure, development, etching, photoresist stripping and others, but also include other processing processes, which are subject to desired patterns formed in the actual manufacturing process, and which are not limited here. For example, the post-baking process may also be included after development and before etching.

Here, the deposition process may be chemical vapor deposition, plasma enhanced chemical vapor deposition or physical vapor deposition, which is not limited here. The mask plate used in the masking process may be a Half Tone Mask, Single Slit Mask or Gray Tone Mask, which is not limited here. The etching may be dry etching or wet etching, which is not limited here.

In order to better understand technical solutions of the above-mentioned manufacturing method provided by embodiments of the disclosure, it will be illustrated below in details by taking the fabrication of the display substrates shown in FIG. 6, FIG. 12 and FIG. 19 as examples.

Figure 6:
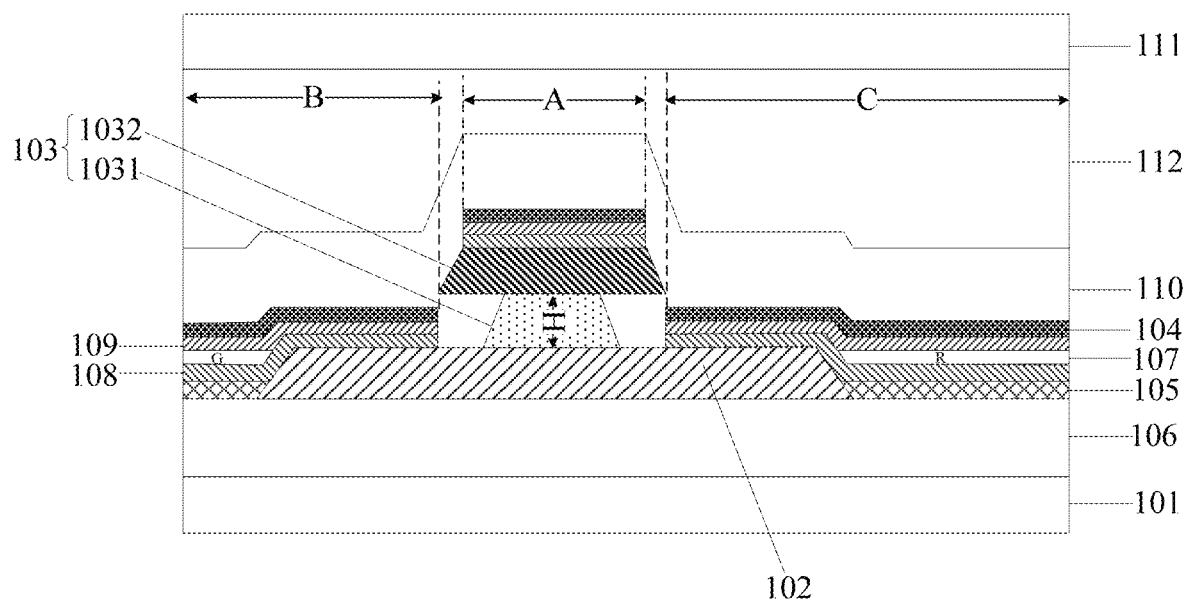
FIG. 6 is a third structural schematic diagram of a display region on a display substrate according to an embodiment of the disclosure.
Figure 7:
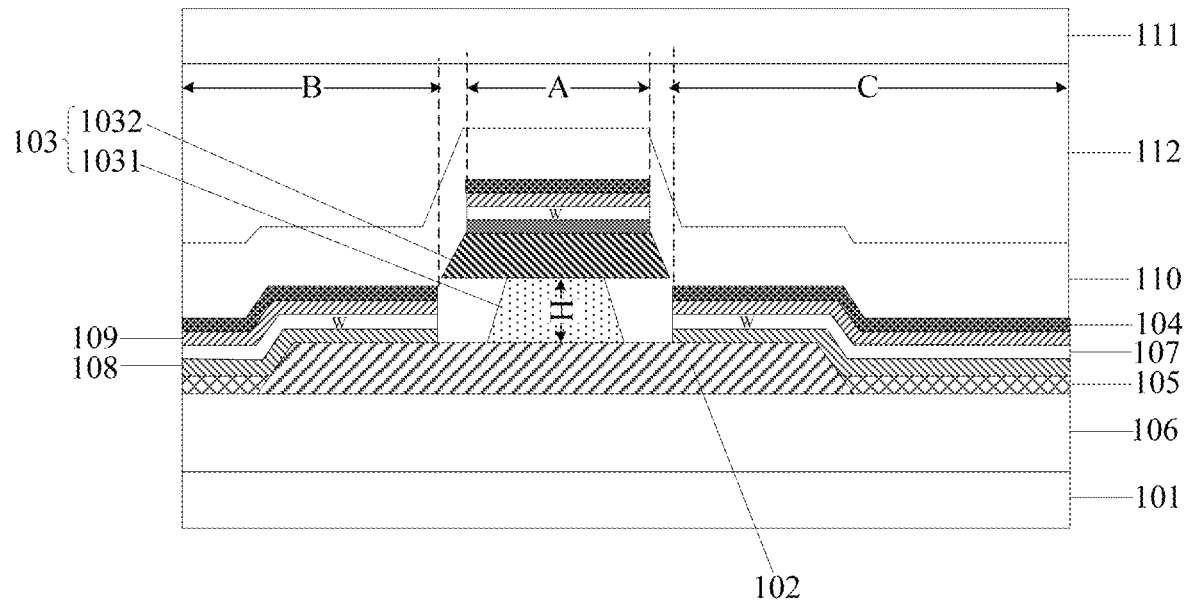
FIG. 7 is a fourth structural schematic diagram of a display region on a display substrate according to an embodiment of the disclosure.
Figure 8:
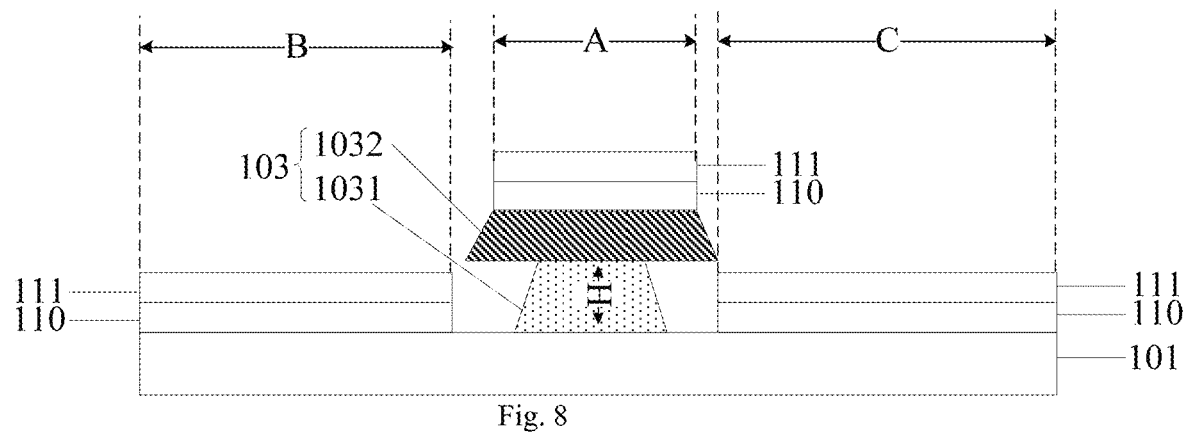
FIG. 8 is a structural schematic diagram of a bezel region on the display substrate shown in FIG. 6 or FIG. 7.

The process of manufacturing the display substrate shown in FIG. 6 is as follows.

Figure 23:
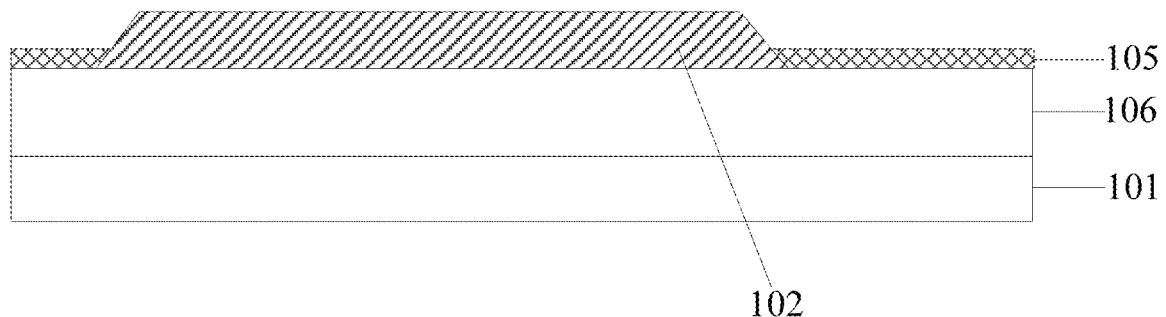
FIGS. 23 to 29 are respectively structural schematic diagrams of a display substrate corresponding to steps in the process of manufacturing the display substrate shown in FIG. 6 by using the manufacturing method according to an embodiment of the disclosure.

Step 1: providing a base substrate 101; forming a transistor layer 106, a pixel definition layer 102 including a plurality of pixel openings, and an anode 105 disposed in each pixel opening area sequentially on the base substrate 101 by an existing method; and annealing the anode 105, so that a material of the anode 105 changes from amorphous indium tin oxide to crystalline indium tin oxide, as shown in FIG. 23.

Figure 24:
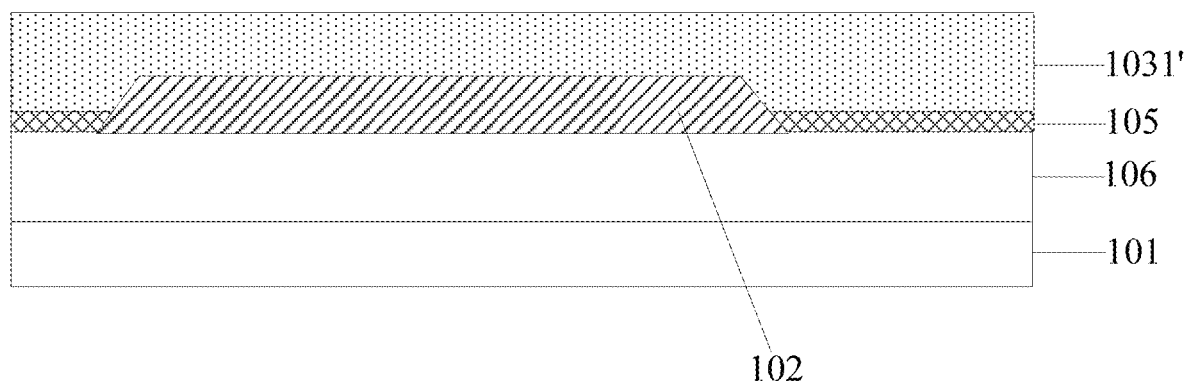

Step 2: forming a support layer 1031' on the pixel definition layer 102, as shown in FIG. 24. The support layer 1031' is a metal layer or a metal oxide layer. Optionally, the material of the metal layer may be, but not limited to, molybdenum, aluminum, silver, copper, titanium, platinum, tungsten, tantalum, niobium, tantalum nitride or alloys thereof. The metal oxide layer may be amorphous Indium Tin Oxide (a-ITO).

Figure 25:
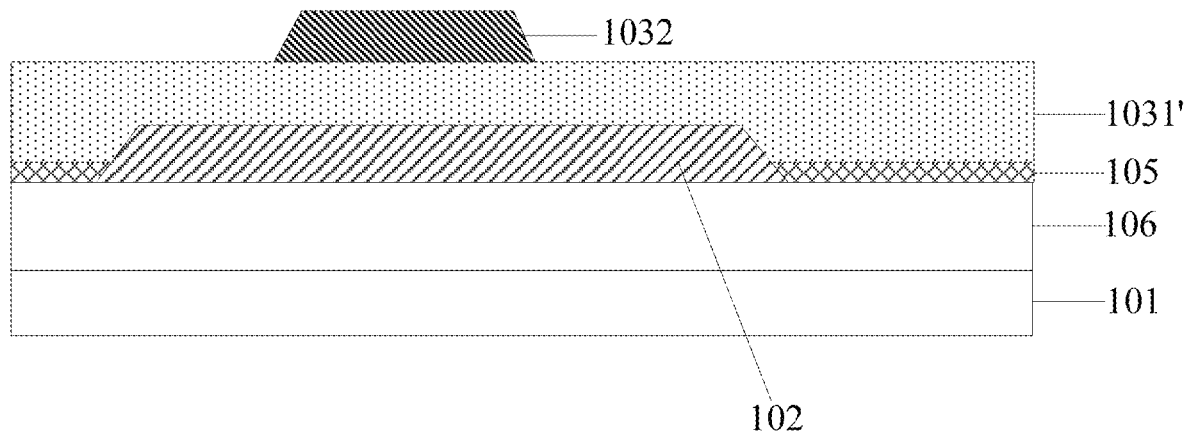

Step 3: forming a second isolation portion 1032 on the support layer 1031'. The cross section of the second isolation portion 1032 is a normal trapezoid structure with a narrow top and a wide bottom in the direction perpendicular to the base substrate 101, as shown in FIG. 25. The second isolation portion 1032 is a spacer layer (PS).

Figure 26:
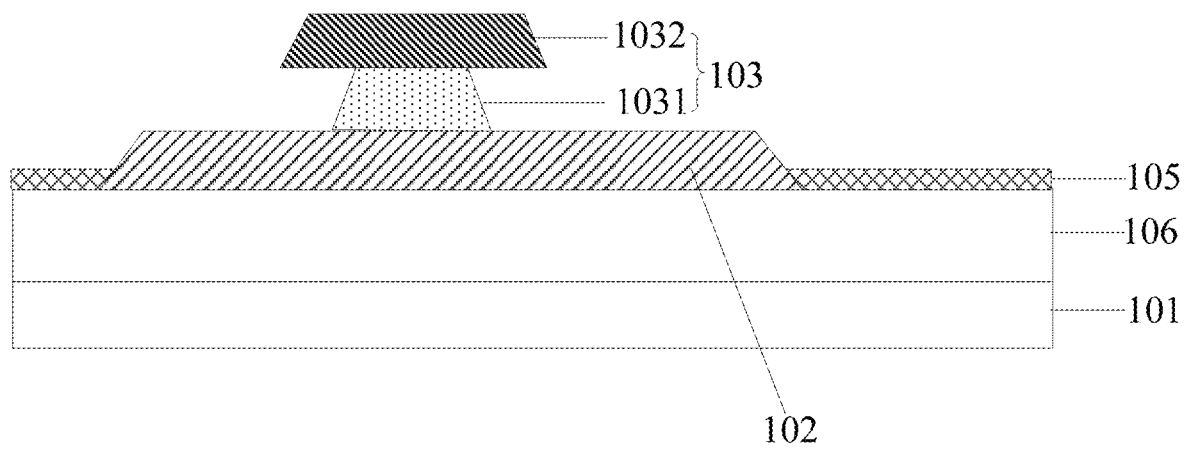

Step 4: etching the support layer 1031' by a wet etching process to form a first isolation portion 1031 covered by the second isolation portion 1032. The cross section of the first isolation portion 1031 is a normal trapezoid structure with a narrow top and a wide bottom in the direction perpendicular to the base substrate 101, and there are gaps between two sides of the first isolation portion 1031 and the second isolation portion. Therefore, the isolation layer 103 composed of the first isolation portion 1031 and the second isolation portion 1032 is formed, as shown in FIG. 26. As can be seen from FIG. 26, the cross section of the isolation layer 103 in the direction perpendicular to the base substrate 101 is approximately T-shaped.

Figure 27:
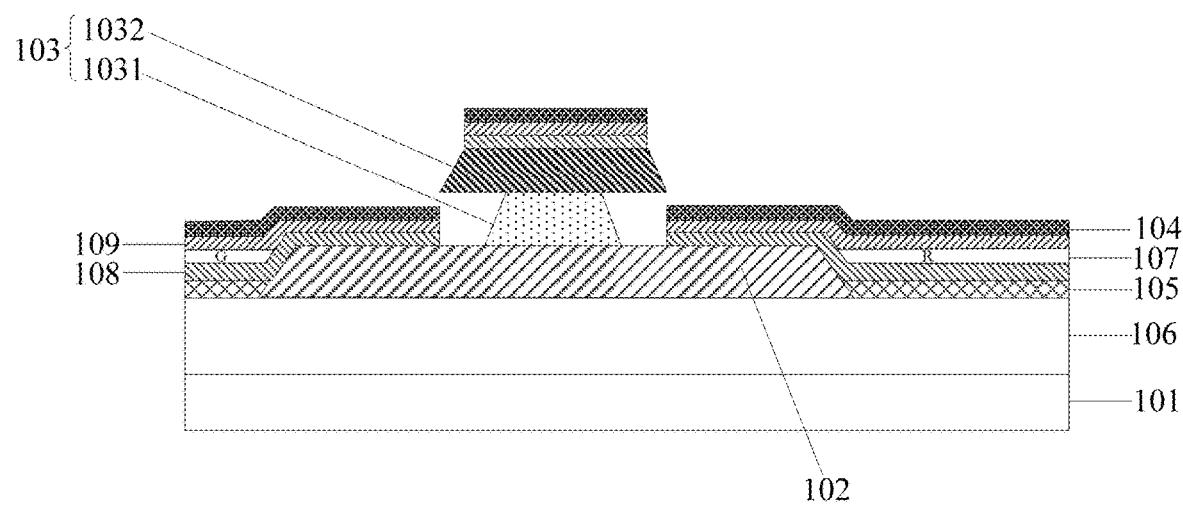

Step 5: forming a first co-evaporated layer 108, a light-emitting layer 107, a second co-evaporated layer 109 and a cathode 104 sequentially on the isolation layer 103, as shown in FIG. 27. Optionally, the light-emitting layer 107 is an RGB three-color light-emitting layer provided only in the pixel opening area; the first co-evaporated layer 108 includes but is not limited to a hole injection layer, a hole transport layer and an electron blocking layer; and the second co-evaporated layer 109 includes but is not limited to an electron injection layer, an electron transport layer and a hole blocking layer. Also, in order to disconnect the cathode 104 at the inner recess of the first isolation portion 1031 relative to the second isolation portion 1032 to be multiplexed as a self-capacitance electrode, the thickness H of the first isolation portion 1031 needs to be larger than the thickness of the cathode 104.

Step 6: forming a first inorganic thin film encapsulation layer 110, an organic thin film encapsulation layer 112 and a second inorganic thin film encapsulation layer 111 sequentially on the layer where the cathode 104 is located by the existing process, as shown in FIG. 6. Also, in order to prevent the Thin Film Encapsulation layer (TFE) composed of the first inorganic thin film encapsulation layer 110, the organic thin film encapsulation layer 112 and the second inorganic thin film encapsulation layer 111 from breaking to ensure the encapsulation effect, the thickness H of the first isolation portion 1031 needs to be smaller than the thickness of the first inorganic thin film encapsulation layer 110.

Therefore, the fabrication of the display substrate shown in FIG. 6 is completed.

Furthermore, the display substrate shown in FIG. 6 may also be fabricated through the following method.

Step 1: providing a base substrate 101; forming a transistor layer 106, a pixel definition layer 102 including a plurality of pixel openings, and an anode 105 disposed in each pixel opening area sequentially on the base substrate 101 by an existing method; and annealing the anode 105, so that the material of the anode 105 changes from amorphous indium tin oxide to crystalline indium tin oxide, as shown in FIG. 23.

Figure 28:
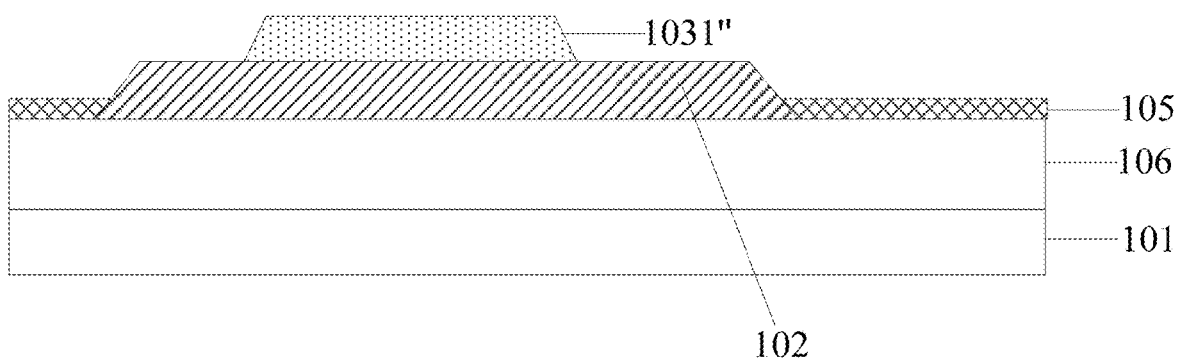

Step 2: forming a support portion 1031" on the pixel definition layer 102. The cross section of the support portion 1031" is a normal trapezoid structure with a narrow top and a wide bottom in the direction perpendicular to the base substrate 101, as shown in FIG. 28. The support portion 1031" is a metal layer or a metal oxide layer. Optionally, the material of the metal layer may be, but not limited to, molybdenum, aluminum, silver, copper, titanium, platinum, tungsten, tantalum, niobium, tantalum nitride or alloys thereof. The metal oxide layer may be amorphous Indium Tin Oxide (a-ITO).

Figure 29:
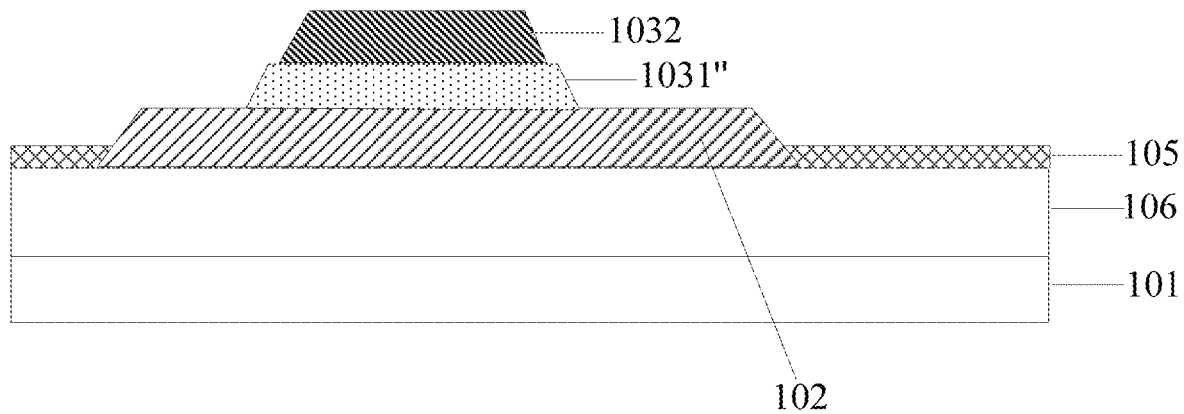

Step 3: forming a second isolation portion 1032 on the support portion 1031". The cross section of the second isolation portion 1032 is a normal trapezoid structure with a narrow top and a wide bottom in the direction perpendicular to the base substrate 101, and the top edge of the support portion 1031" is greater than or equal to the bottom edge of the second portion 1032, as shown in FIG. 29. The second isolation portion 1032 is a spacer layer (PS).

Step 4: etching the support portion 1031" by a wet etching process to form a first isolation portion 1031 covered by the second isolation portion 1032. The cross section of the first isolation portion 1031 is a normal trapezoid structure with a narrow top and a wide bottom in the direction perpendicular to the base substrate 101, and there are gaps between two sides of the first isolation portion 1031 and the second isolation portion. Therefore, the isolation layer 103 composed of the first isolation portion 1031 and the second isolation portion 1032 is formed, as shown in FIG. 26. As can be seen from FIG. 26, the cross section of the isolation layer 103 in the direction perpendicular to the base substrate 101 is approximately T-shaped.

Step 5: forming a first co-evaporated layer 108, a light-emitting layer 107, a second co-evaporated layer 109 and a cathode 104 sequentially on the isolation layer 103, as shown in FIG. 27. Optionally, the light-emitting layer 107 is an RGB three-color light-emitting layer provided only in the pixel opening area; the first co-evaporated layer 108 includes but is not limited to a hole injection layer, a hole transport layer and an electron blocking layer; and the second co-evaporated layer 109 includes but is not limited to an electron injection layer, an electron transport layer and a hole blocking layer. Also, in order to disconnect the cathode 104 at the inner recess of the first isolation portion 1031 relative to the second isolation portion 1032 to be multiplexed as a self-capacitance electrode, the thickness H of the first isolation portion 1031 needs to be larger than the thickness of the cathode 104.

Step 6: forming a first inorganic thin film encapsulation layer 110, an organic thin film encapsulation layer 112 and a second inorganic thin film encapsulation layer 111 sequentially on the layer where the cathode 104 is located by the existing process, as shown in FIG. 6. Also, in order to prevent the Thin Film Encapsulation layer (TFE) composed of the first inorganic thin film encapsulation layer 110, the organic thin film encapsulation layer 112 and the second inorganic thin film encapsulation layer 111 from breaking to ensure the encapsulation effect, the thickness H of the first isolation portion 1031 needs to be smaller than the thickness of the first inorganic thin film encapsulation layer 110.

Therefore, the fabrication of the display substrate shown in FIG. 6 is completed.

Figure 5:
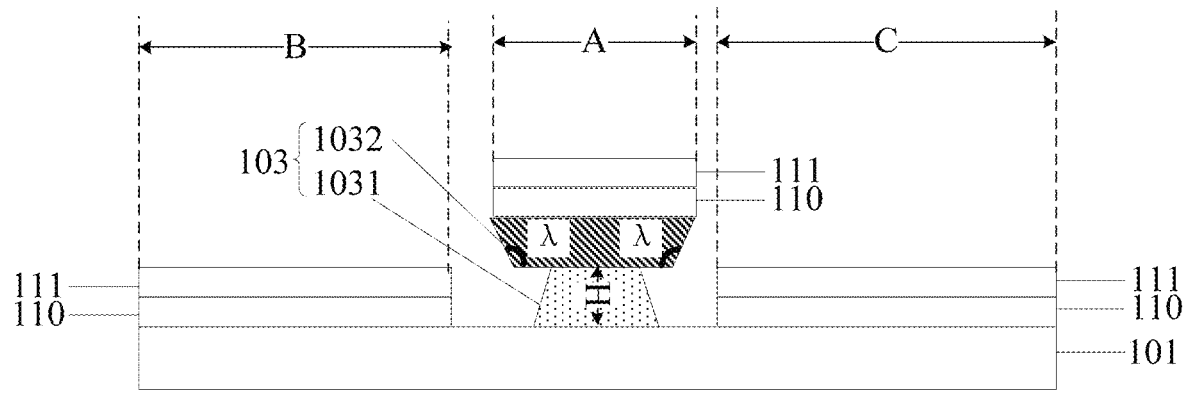
FIG. 5 is a structural schematic diagram of a bezel region on the display substrate shown in FIG. 3 or FIG. 4.

It should be noted that, on the basis of the above-mentioned process of fabricating the second isolation portion 1032 of which the cross section is a normal trapezoid structure with a narrow top and a wide bottom, the slope angles of both side edges of the second isolation portion 1032 in the cross section of the second isolation portion 1032 in the direction perpendicular to the base substrate 101 can be both obtuse angles λ by extending the development time appropriately and reducing the time and temperature of the pre-baking process or changing the material simply, that is, the cross section of the second isolation portion 1032 is an inverted trapezoid structure with a wide top and a narrow bottom, as shown in FIGS. 3-5.

Figure 12:
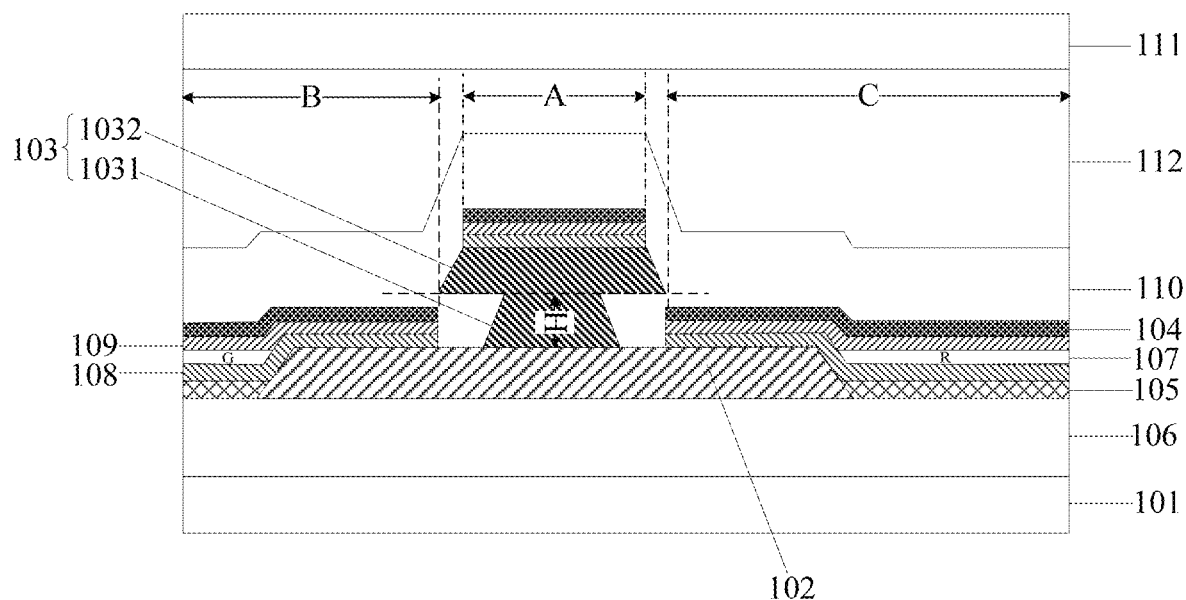
FIG. 12 is a seventh structural schematic diagram of a display region on a display substrate according to an embodiment of the disclosure.

The process of manufacturing the display substrate shown in FIG. 12 is as follows.

Step 1: providing a base substrate 101; forming a transistor layer 106, a pixel definition layer 102 including a plurality of pixel openings, and an anode 105 disposed in each pixel opening area sequentially on the base substrate 101 by an existing method; and annealing the anode 105, so that the material of the anode 105 changes from amorphous indium tin oxide to crystalline indium tin oxide, as shown in FIG. 23.

Figure 30:
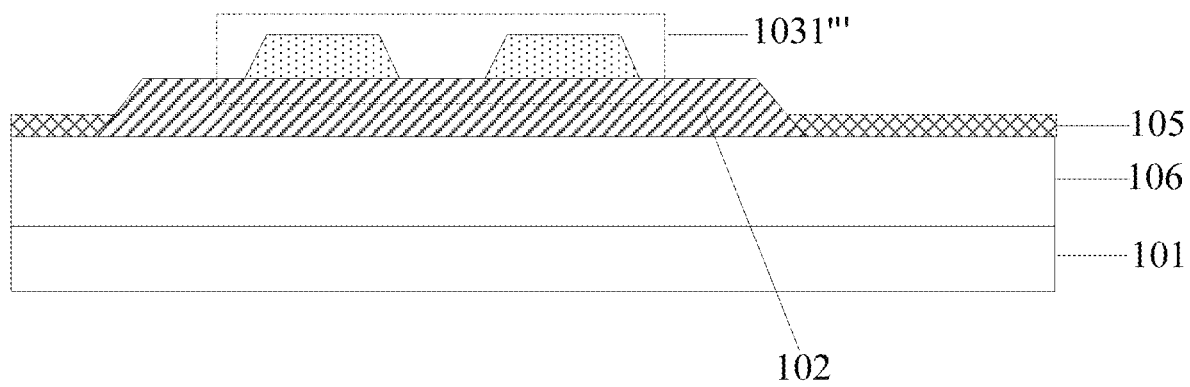
FIGS. 30 to 33 are respectively structural schematic diagrams of a display substrate corresponding to steps in the process of manufacturing the display substrate shown in FIG. 13 by using the manufacturing method according to an embodiment of the disclosure.

Step 2: forming a pair of support portions 1031''' on the pixel definition layer 102. Cross sections of the pair of support portions 1031''' are two normal trapezoid structures with a narrow top and a wide bottom that have a gap in the direction perpendicular to the base substrate 101, as shown in FIG. 30. The pair of support portions 1031" is a metal layer or a metal oxide layer. Optionally, the material of the metal layer may be, but not limited to, molybdenum, aluminum, silver, copper, titanium, platinum, tungsten, tantalum, niobium, tantalum nitride or alloys thereof. The metal oxide layer may be amorphous Indium Tin Oxide (a-ITO).

Figure 31:
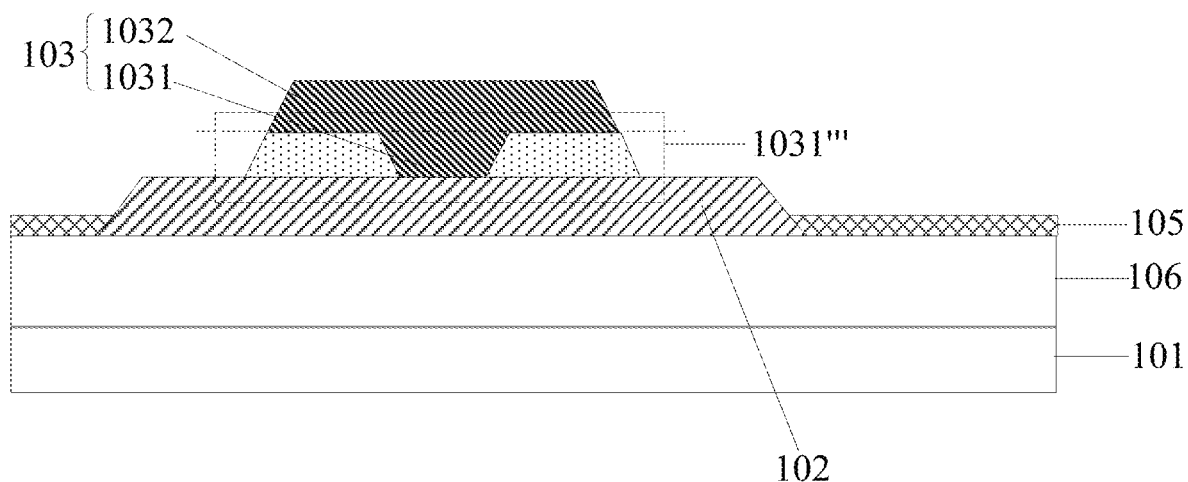

Step 3: forming an isolation layer 103 on the pair of support portions 1031". The isolation layer 103 includes a first isolation portion 1031 filling the gap, and a second isolation portion 1032 covering the pair of support portions 1031''' and the gap; the cross sections of the first isolation portion 1031 and the second isolation portion 1032 are both normal trapezoid structures with a narrow top and a wide bottom in the direction perpendicular to the base substrate 101, and both sides of the first isolation portion 1031 are concave inwards relative to the second isolation portion 1032, as shown in FIG. 31. The isolation layer 103 is a spacer layer (PS).

Figure 32:
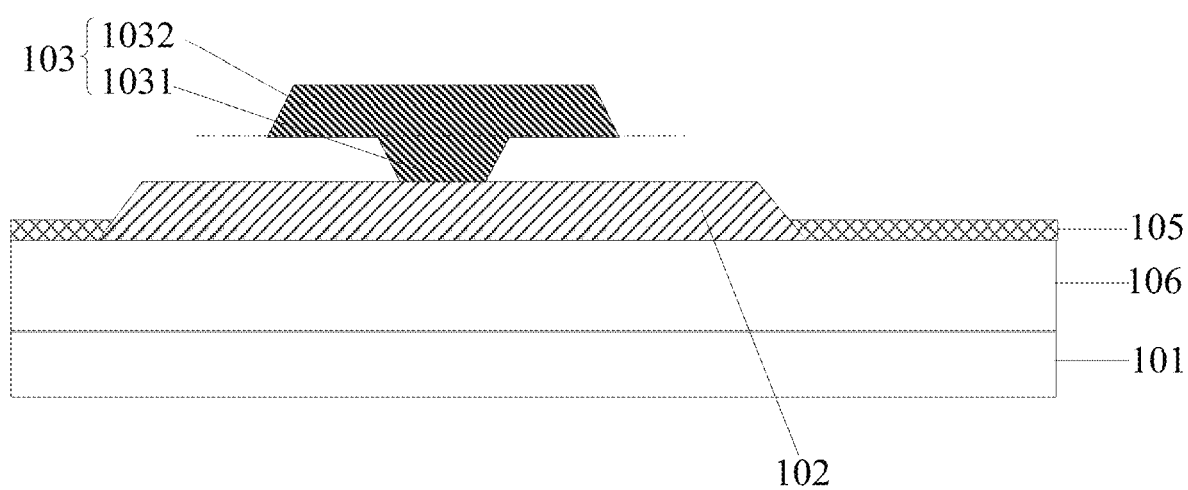

Step 4: etching the pair of support portions 1031" by a wet etching process to remove a pattern of the pair of support portions 1031". Therefore, the isolation layer 103 composed of the first isolation portion 1031 and the second isolation portion 1032 is formed, as shown in FIG. 32. As can be seen from FIG. 32, the cross section of the isolation layer 103 in the direction perpendicular to the base substrate 101 is approximately T-shaped.

Figure 33:
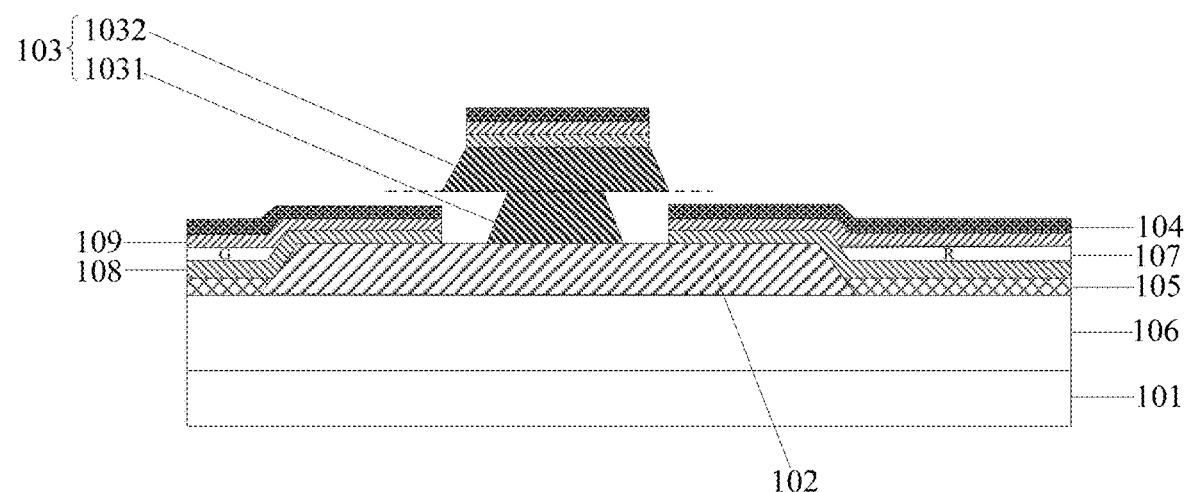

Step 5: forming a first co-evaporated layer 108, a light-emitting layer 107, a second co-evaporated layer 109 and a cathode 104 sequentially on the isolation layer 103, as shown in FIG. 33. Optionally, the light-emitting layer 107 is an RGB three-color light-emitting layer provided only in the pixel opening area; the first co-evaporated layer 108 includes but is not limited to a hole injection layer, a hole transport layer and an electron blocking layer; and the second co-evaporated layer 109 includes but is not limited to an electron injection layer, an electron transport layer and a hole blocking layer. Also, in order to disconnect the cathode 104 at the inner recess of the first isolation portion 1031 relative to the second isolation portion 1032 to be multiplexed as a self-capacitance electrode, the thickness H of the first isolation portion 1031 needs to be larger than the thickness of the cathode 104.

Figure 13:
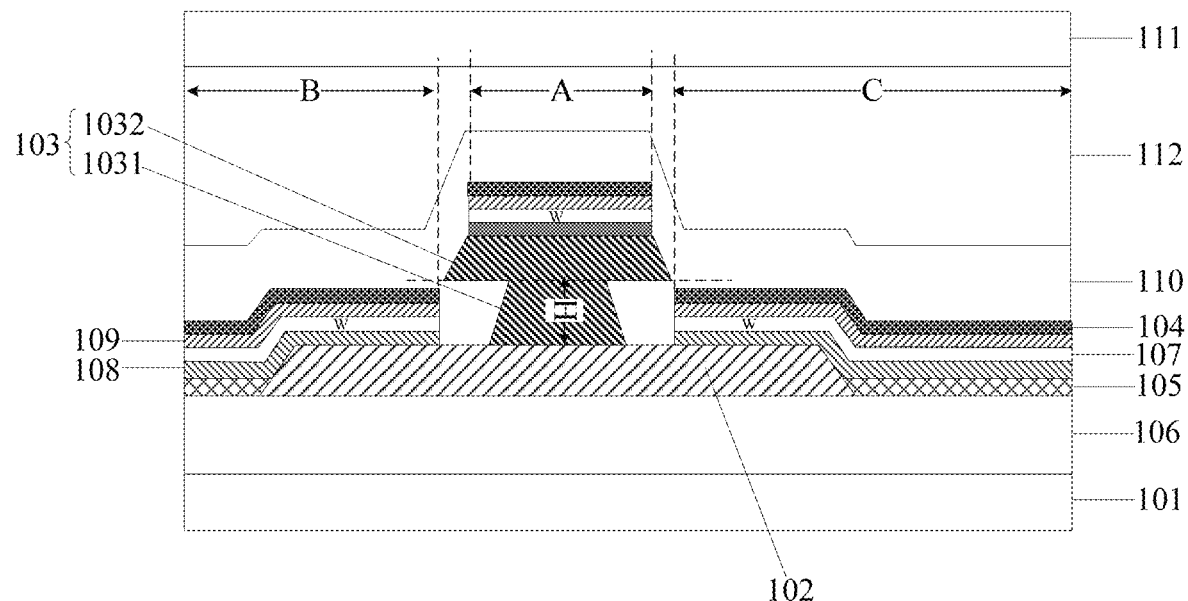
FIG. 13 is an eighth structural schematic diagram of a display region on a display substrate according to an embodiment of the disclosure.
Figure 14:
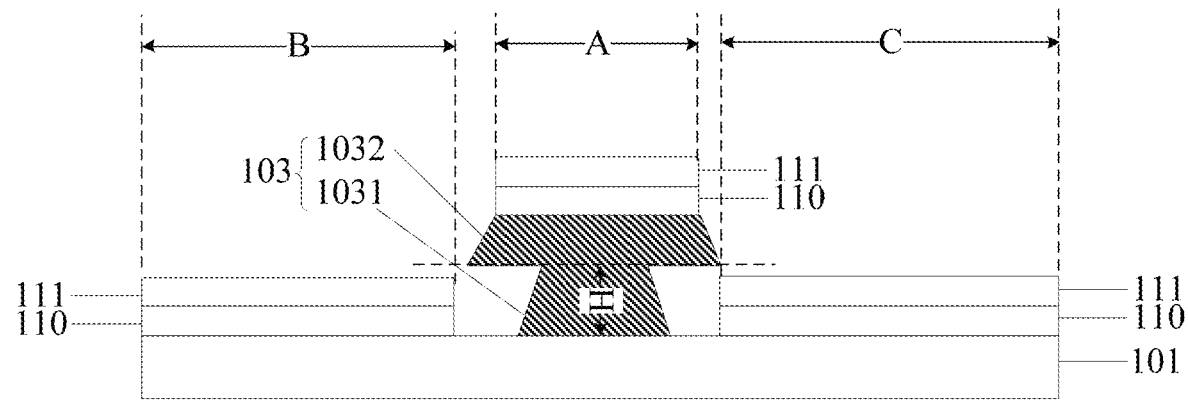
FIG. 14 is a structural schematic diagram of a bezel region on the display substrate shown in FIG. 12 or FIG. 13.
Figure 15:
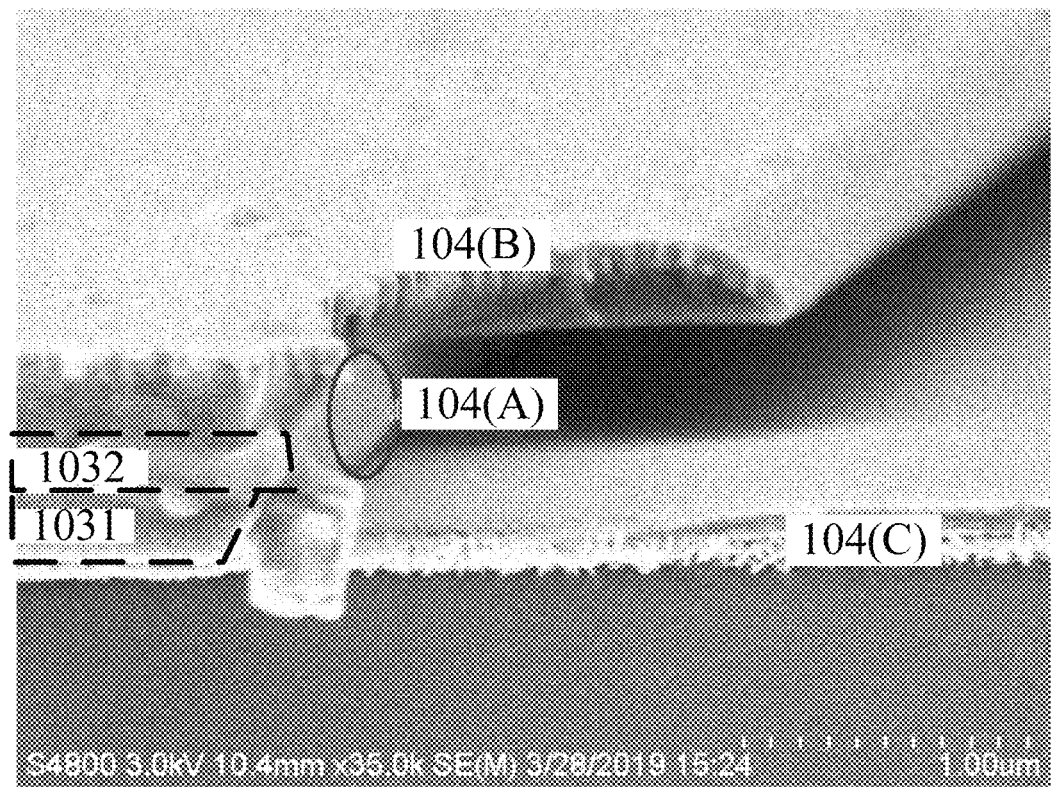
FIG. 15 is a scanning electron microscope view of the display region on the display substrate shown in FIG. 13.

Step 6: forming a first inorganic thin film encapsulation layer 110, an organic thin film encapsulation layer 112 and a second inorganic thin film encapsulation layer 111 sequentially on the layer where the cathode 104 is located by the existing process, as shown in FIG. 13. Also, in order to prevent the Thin Film Encapsulation layer (TFE) composed of the first inorganic thin film encapsulation layer 110, the organic thin film encapsulation layer 112 and the second inorganic thin film encapsulation layer 111 from breaking to ensure the encapsulation effect, the thickness H of the first isolation portion 1031 needs to be smaller than the thickness of the first inorganic thin film encapsulation layer 110.

Therefore, the fabrication of the display substrate shown in FIG. 12 is completed.

Figure 9:
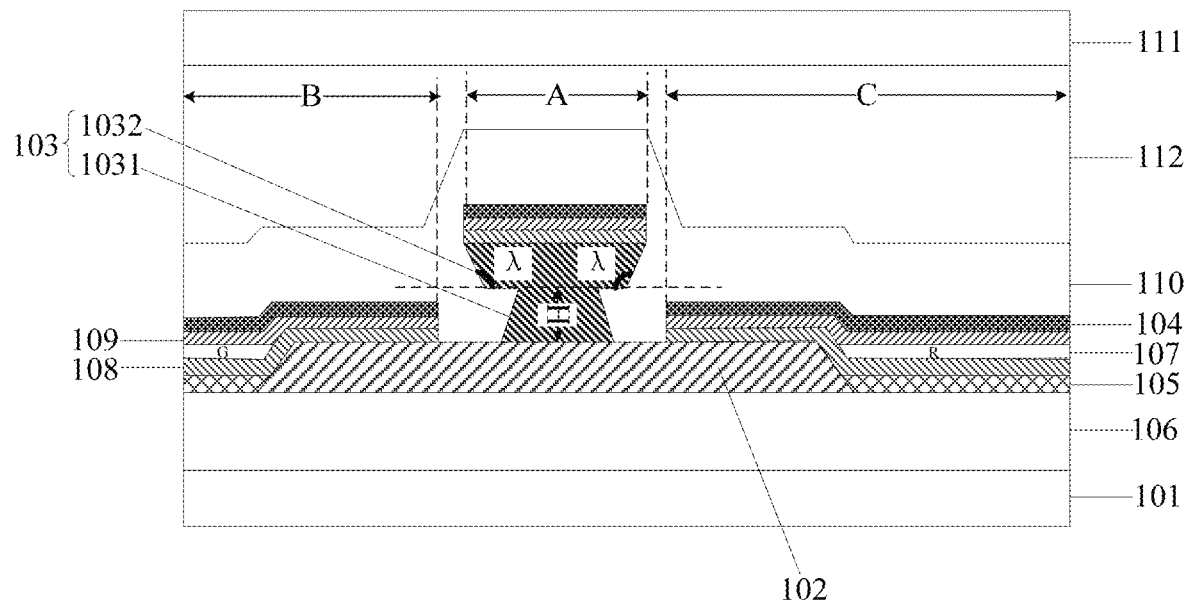
FIG. 9 is a fifth structural schematic diagram of a display region on a display substrate according to an embodiment of the disclosure.
Figure 10:
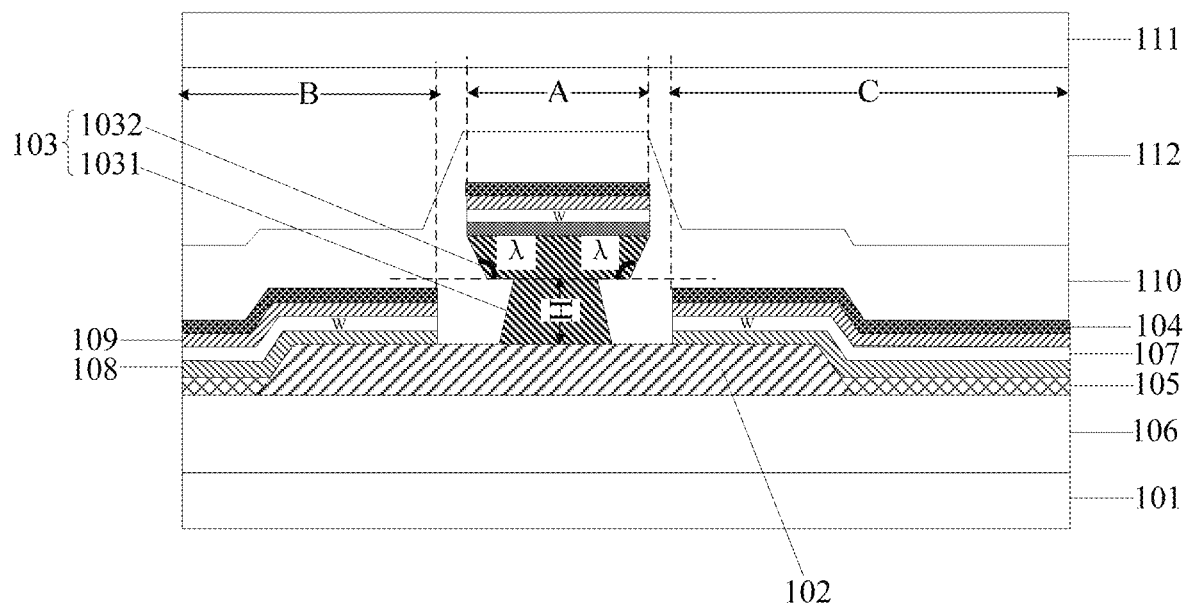
FIG. 10 is a sixth structural schematic diagram of a display region on a display substrate according to an embodiment of the disclosure.
Figure 11:
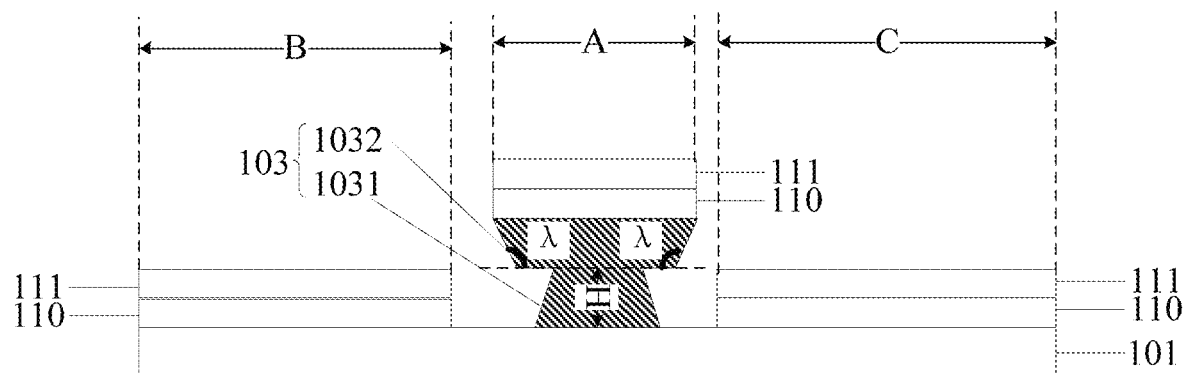
FIG. 11 is a structural schematic diagram of a bezel region on the display substrate shown in FIG. 9 or FIG. 10.

It should be noted that, on the basis of the above-mentioned process of fabricating the second isolation portion 1032 of which the cross section is a normal trapezoid structure with a narrow top and a wide bottom, the slope angles of both side edges of the second isolation portion 1032 in the cross section of the second isolation portion 1032 in the direction perpendicular to the base substrate 101 can be both obtuse angles λ by extending the development time appropriately and reducing the time and temperature of the pre-baking process or changing the material simply, that is, the cross section of the second isolation portion 1032 is an inverted trapezoid structure with a wide top and a narrow bottom, as shown in FIGS. 9-11.

The process of manufacturing the display substrate shown in FIG. 19 is as follows.

Step 1: providing a base substrate 101; forming a transistor layer 106, a pixel definition layer 102 including a plurality of pixel openings, and an anode 105 disposed in each pixel opening area sequentially on the base substrate 101 by an existing method; and annealing the anode 105, so that the material of the anode 105 changes from amorphous indium tin oxide to crystalline indium tin oxide, as shown in FIG. 23.

Figure 34:
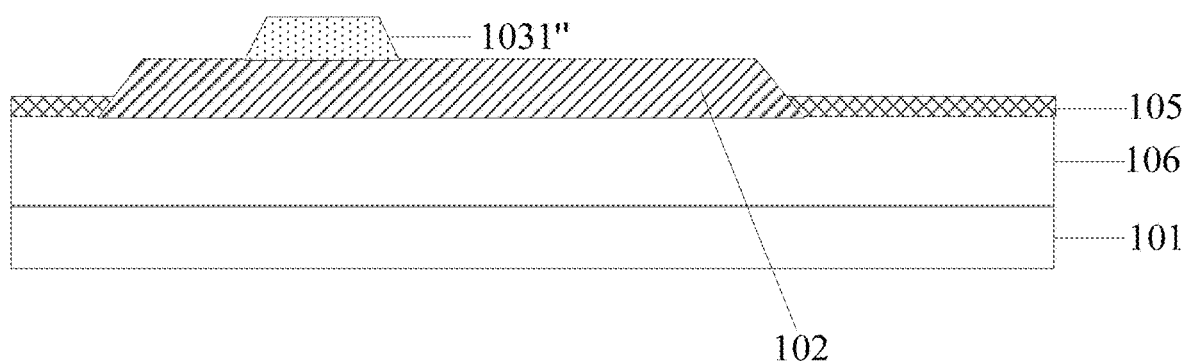
FIGS. 34 to 37 are respectively structural schematic diagrams of a display substrate corresponding to steps in the process of manufacturing the display substrate shown in FIG. 19 by using the manufacturing method according to an embodiment of the disclosure.

Step 2: forming a support portion 1031" on the pixel definition layer 102. The cross section of the support portion 1031" is a normal trapezoid structure with a narrow top and a wide bottom in the direction perpendicular to the base substrate 101, as shown in FIG. 34. The support portion 1031" is a metal layer or a metal oxide layer. Optionally, the material of the metal layer may be, but not limited to, molybdenum, aluminum, silver, copper, titanium, platinum, tungsten, tantalum, niobium, tantalum nitride or alloys thereof. The metal oxide layer may be amorphous Indium Tin Oxide (a-ITO).

Figure 35:
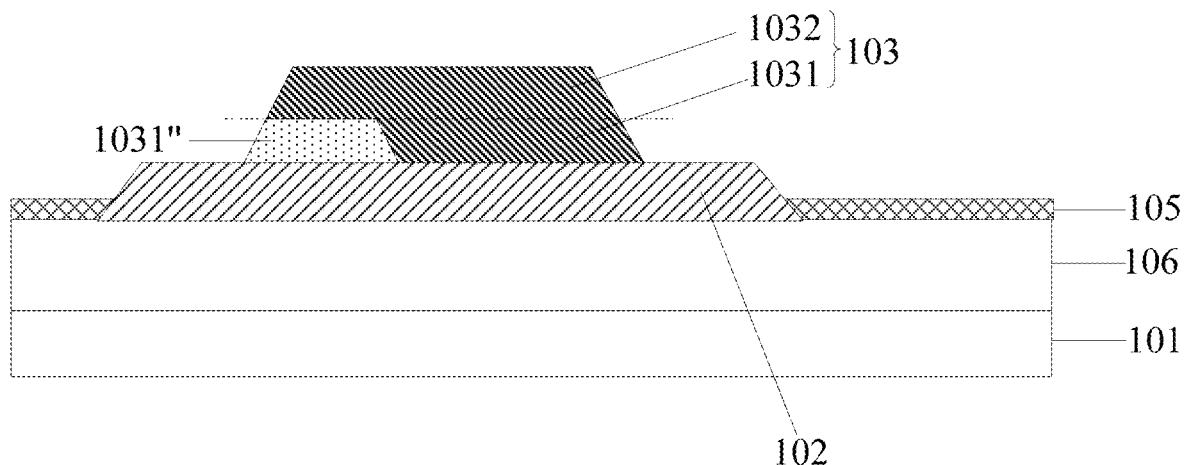

Step 3: forming an isolation layer 103 on the support portion 1031". The isolation layer 103 includes a first isolation portion 1031 with a same height as the support portion 1031", and a second isolation portion 1032 covering the support portion 1031" and the first isolation portion 1031. The cross section of the first isolation portion 1031 is a parallelogram structure in the direction perpendicular to the base substrate 101, the cross section of the second isolation portion 1032 is a normal trapezoid structures with a narrow top and a wide bottom in the direction perpendicular to the base substrate 101, and one side of the first isolation portion 1031 is concave inwards relative to the second isolation portion 1032, as shown in FIG. 35. The isolation layer 103 is a spacer layer (PS).

Figure 36:
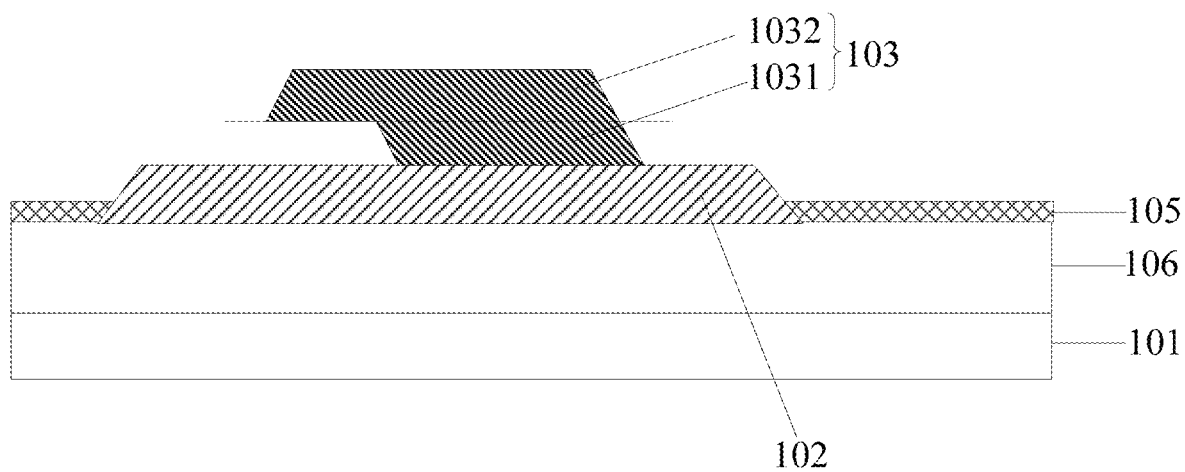

Step 4: etching the support portion 1031" by a wet etching process to remove a pattern of the support portion 1031". Therefore, the isolation layer 103 composed of the first isolation portion 1031 and the second isolation portion 1032 is formed, as shown in FIG. 36. As can be seen from FIG. 36, the cross section of the isolation layer 103 in the direction perpendicular to the base substrate 101 is approximately T-shaped.

Figure 37:
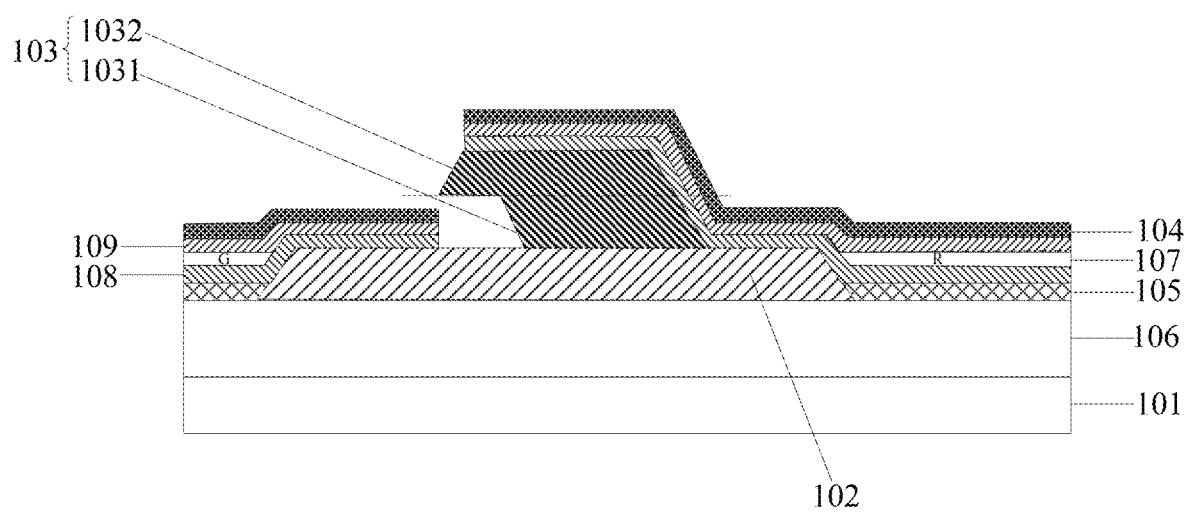

Step 5: forming a first co-evaporated layer 108, a light-emitting layer 107, a second co-evaporated layer 109 and a cathode 104 sequentially on the isolation layer 103, as shown in FIG. 37. Optionally, the light-emitting layer 107 is an RGB three-color light-emitting layer provided only in the pixel opening area; the first co-evaporated layer 108 includes but is not limited to a hole injection layer, a hole transport layer and an electron blocking layer; and the second co-evaporated layer 109 includes but is not limited to an electron injection layer, an electron transport layer and a hole blocking layer. Also, in order to disconnect the cathode 104 at the inner recess of the first isolation portion 1031 relative to the second isolation portion 1032 to be multiplexed as a self-capacitance electrode, the thickness H of the first isolation portion 1031 needs to be larger than the thickness of the cathode 104.

Step 6: forming a first inorganic thin film encapsulation layer 110, an organic thin film encapsulation layer 112 and a second inorganic thin film encapsulation layer 111 sequentially on the layer where the cathode 104 is located by the existing process, as shown in FIG. 19. Also, in order to prevent the Thin Film Encapsulation layer (TFE) composed of the first inorganic thin film encapsulation layer 110, the organic thin film encapsulation layer 112 and the second inorganic thin film encapsulation layer 111 from breaking to ensure the encapsulation effect, the thickness H of the first isolation portion 1031 needs to be smaller than the thickness of the first inorganic thin film encapsulation layer 110.

Therefore, the fabrication of the display substrate shown in FIG. 19 is completed.

It should be noted that, on the basis of the above-mentioned process of fabricating the second isolation portion 1032 of which the cross section is a normal trapezoid structure with a narrow top and a wide bottom, the slope angle of one side edge of the second isolation portion 1032 in the cross section of the second isolation portion 1032 in the direction perpendicular to the base substrate 101 can be an obtuse angles λ by extending the development time appropriately and reducing the time and temperature of the pre-baking process or changing the material simply, that is, the cross section of the second isolation portion 1032 is a parallelogram structure, as shown in FIGS. 16-18.

Based on the same disclosure concept, an embodiment of the disclosure further provides a display panel, including the above-mentioned display substrate provided by an embodiment of the disclosure. The display panel may be: a Passive Matrix Organic Light Emitting Diode (PMOLED) or an Active Matrix Organic Light Emitting Diode (AMOLED). Since the principle of the display panel to solve the problem is similar to the principle of the above-mentioned display substrate to solve the problem, implementations of the display panel can refer to embodiments of the above-mentioned display substrate, and the repeated description thereof will be omitted.

Based on the same disclosure concept, an embodiment of the disclosure further provides a display device, including the above-mentioned display panel provided by an embodiment of the disclosure. The display device may be: a mobile phone, a tablet computer, a television, a display, a notebook computer, a digital photo frame, a navigator, a smart watch, a fitness wristband, a personal digital assistant, or any other product or component with display function. Since the principle of the display device to solve the problem is similar to the principle of the above-mentioned display panel to solve the problem, implementations of the display device can refer to embodiments of the above-mentioned display panel, and the repeated description thereof will be omitted.

The above-mentioned display substrate, a manufacturing method therefor, a display panel and a display device provided by embodiments of the disclosure include: a base substrate, and a pixel definition layer, an isolation layer and an isolated layer sequentially located on the base substrate; where the pixel definition layer includes a plurality of pixel openings; the isolation layer does not overlap with each pixel opening, and the isolation layer includes a first isolation portion and a second isolation portion located on a side of the first isolation portion away from the base substrate and covering the first isolation portion; the slope angle of at least one side edge in the cross section of the second isolation portion is an obtuse angle in the direction perpendicular to the base substrate, the first isolation portion has a gap between the obtuse angle and the second isolation portion, there is a gap between the first isolation portion and the second isolation portion at the obtuse angle, and the thickness of the first isolation portion is greater than the thickness of the isolated layer; the isolated layer includes: a first isolated portion covering the isolation layer, and a second isolated portion and a third isolated portion on both sides of the first isolation portion respectively. Through the arrangement of the first isolation portion and the second isolation portion, the first isolated portion is disconnected from at least one of the second isolated portion and the third isolated portion, so the effect of cathode isolation is enhanced in the case where the isolated layer is a cathode contained in the display region; and the cracks generated in the process of cutting the motherboard to obtain a plurality of display substrates or the cracks due to other causes are effectively prevented from extending to the display region in the case where the isolated layer is the first inorganic thin film encapsulation layer and the second inorganic thin film encapsulation layer contained in the bezel region; and based on this, the display quality and the touch effect are improved.

Evidently those skilled in the art can make various modifications and variations to the disclosure without departing from the spirit and scope of the disclosure. Thus the disclosure is also intended to encompass these modifications and variations to the disclosure as long as these modifications and variations come into the scope of the claims of the disclosure and their equivalents.

What is claimed is:

1. A display substrate, comprising:
a base substrate;
a pixel definition layer, the pixel definition layer being located on a side of the base substrate and comprising: a plurality of pixel openings penetrating through the pixel definition layer;
an isolation layer, the isolation layer being located on a side of the pixel definition layer away from the base substrate, not overlapping with each of the pixel openings, and the isolation layer comprising a first isolation portion and a second isolation portion located on a side of the first isolation portion away from the base substrate and covering the first isolation portion, wherein a slope angle formed by at least one side edge and a bottom edge in a cross section of the second isolation portion is an obtuse angle in a direction perpendicular to the base substrate, and there is a gap between the first isolation portion and the second isolation portion at the obtuse angle;
an isolated layer, the isolated layer being located on a side of the isolation layer away from the pixel definition layer and the isolated layer comprising: a first isolated portion covering the isolation layer, and a second isolated portion and a third isolated portion on both sides of the first isolation portion respectively, wherein a thickness of the first isolation portion is larger than a thickness of the isolated layer.

2. The display substrate of claim 1, wherein the isolated layer comprises: a cathode located in a display region of the base substrate and multiplexed as a self-capacitance electrode.

3. The display substrate of claim 2, wherein the isolated layer further comprises: a white light emitting layer located between the cathode and the isolation layer.

4. The display substrate of claim 1, wherein the isolated layer comprises: a first inorganic thin film encapsulation layer and a second inorganic thin film encapsulation layer located in a bezel region of the base substrate.

5. The display substrate of claim 2, wherein the display region further comprises:
a first inorganic thin film encapsulation layer, an organic thin film encapsulation layer and a second inorganic thin film encapsulation layer located on the cathode;
the thickness of the first isolation portion is smaller than a thickness of the first inorganic thin film encapsulation layer in the direction perpendicular to the base substrate.

6. The display substrate of claim 1, wherein a cross section of the second isolation portion is an inverted trapezoid structure and a cross section of the first isolation portion is a normal trapezoid structure or an inverted trapezoid structure in the direction perpendicular to the base substrate.

7. The display substrate of claim 6, wherein the first isolation portion and the second isolation portion are a spacer layer with an integral structure.

8. The display substrate of claim 6, wherein the first isolation portion is a metal layer or a metal oxide layer, and the second isolation portion is a spacer layer.

9. The display substrate of claim 1, wherein cross sections of the first isolation portion and the second isolation portion are both parallelogram structures in the direction perpendicular to the base substrate.

10. The display substrate of claim 9, wherein the first isolation portion and the second isolation portion are a spacer layer with an integral structure.

11. A manufacturing method for a display substrate, comprising:

providing a base substrate;

forming a pixel definition layer comprising a plurality of pixel openings penetrating through the pixel definition layer, an isolation layer and an isolated layer sequentially on the base substrate; wherein:

the isolation layer does not overlap with each of the pixel openings, and the isolation layer comprises a first isolation portion and a second isolation portion located on a side of the first isolation portion away from the base substrate and covering the first isolation portion;

a slope angle formed by at least one side edge and a bottom edge in a cross section of the second isolation portion is an obtuse angle in a direction perpendicular to the base substrate, there is a gap between the first isolation portion and the second isolation portion at the obtuse angle, and a thickness of the first isolation portion is larger than a thickness of the isolated layer;

the isolated layer comprises: a first isolated portion covering the isolation layer, and a second isolated portion and a third isolated portion on both sides of the first isolation portion respectively.

12. The manufacturing method of claim 11, wherein forming the isolation layer, comprises:

forming a support layer on the pixel definition layer;

forming the second isolation portion on the support layer, wherein a cross section of the second isolation portion is an inverted trapezoid structure in the direction perpendicular to the base substrate;

etching the support layer by a wet etching process to form the first isolation portion covered by the second isolation portion; wherein a cross section of the first isolation portion is a normal trapezoid structure in the direction perpendicular to the base substrate, and there are gaps between two sides of the first isolation portion and the second isolation portion;

constituting the isolation layer from the first isolation portion and the second isolation portion.

13. The manufacturing method of claim 11, wherein forming the isolation layer, comprises:

forming a support portion on the pixel definition layer, wherein a cross section of the support portion is a normal trapezoid structure in the direction perpendicular to the base substrate;

forming the second isolation portion on the support portion; wherein a cross section of the second isolation portion is an inverted trapezoid structure in the direction perpendicular to the base substrate, and an upper edge of the support portion is greater than or equal to a bottom edge of the second isolation portion;

etching the support portion by a wet etching process to form the first isolation portion covered by the second isolation portion; wherein a cross section of the first isolation portion is a normal trapezoid structure in the direction perpendicular to the base substrate, and there are gaps between two sides of the first isolation portion and the second isolation portion;

constituting the isolation layer from the first isolation portion and the second isolation portion.

14. The manufacturing method of claim 11, wherein forming the isolation layer, comprises:

forming a pair of support portions on the pixel definition layer, wherein cross sections of the pair of support portions are two normal trapezoid structures with a gap in the direction perpendicular to the base substrate;

forming the isolation layer on the pair of support portions, wherein the isolation layer comprises the first isolation portion filling the gap, and the second isolation portion covering the pair of support portions and the gap; cross sections of the first isolation portion and the second isolation portion are both inverted trapezoid structures in the direction perpendicular to the base substrate, and there are gaps between two sides of the first isolation portion and the second isolation portion;

etching the pair of support portions by a wet etching process to remove a pattern of the pair of support portions.

15. The manufacturing method of claim 11, wherein forming the isolation layer, comprises:

forming a support portion on the pixel definition layer, wherein a cross section of the support portion is a normal trapezoid structure in the direction perpendicular to the base substrate;

forming the isolation layer on the support portion, wherein the isolation layer comprises the first isolation portion with a same height as the support portion, and the second isolation portion covering the support portion and the first isolation portion; cross sections of the first isolation portion and the second isolation portion are both parallelogram structures in the direction perpendicular to the base substrate, and there is a gap between a side of the first isolation portion and the second isolation portion;

etching the support portion by a wet etching process to remove a pattern of the support portion.

16. The manufacturing method of claim 11, wherein after forming the pixel definition layer comprising the plurality of pixel openings and before forming the isolation layer, the method further comprises:

forming a plurality of anodes in the pixel openings, and annealing the anodes.

17. The manufacturing method of claim 11, wherein after forming a cathode, the method further comprises:

forming a first inorganic thin film encapsulation layer on a layer where the cathode is located by an atomic force deposition process.

18. A display panel, comprising: the display substrate of claim 1.

19. A display device, comprising: the display panel of claim 18.

* * * * *